(12) United States Patent
Muraki

(10) Patent No.: US 6,274,877 B1
(45) Date of Patent: *Aug. 14, 2001

(54) ELECTRON BEAM EXPOSURE APPARATUS

(75) Inventor: Masato Muraki, Inagi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 40 days.

(21) Appl. No.: 09/069,748

(22) Filed: Apr. 30, 1998

(30) Foreign Application Priority Data

May 8, 1997 (JP) .................................................. 9-118088
May 8, 1997 (JP) .................................................. 9-118089

(51) Int. Cl.[7] ............................................ G21K 5/10
(52) U.S. Cl. ........................... 250/492.3; 250/492.2; 250/492.22
(58) Field of Search ..................... 250/492.23, 492.2, 250/492.22

(56) References Cited

U.S. PATENT DOCUMENTS 5,359,202 * 10/1994 Yasuda et al. ................. 250/492.2
5,712,488 * 1/1998 Stickel et al. ................. 250/492.23
5,798,196   8/1998 Okino ............................... 430/30
5,834,783  11/1998 Muraki et al. ..................... 250/398
5,895,924 * 4/1999 Yasuda et al. ................. 250/492.22
5,929,457   7/1999 Okino .......................... 250/492.22
5,973,332  10/1999 Muraki et al. .................. 250/492.2

FOREIGN PATENT DOCUMENTS 1-295419  11/1989 (JP) .
09-022118  1/1997 (JP) .

* cited by examiner

Primary Examiner—Teresa M. Arroyo
Assistant Examiner—Nikita Wells
(74) Attorney, Agent, or Firm—Fitzpatrick, Cella, Harper & Scinto

(57) ABSTRACT

Blurring of an electron beam image produced by the Coulomb effect upon forming a pattern on a substrate by exposure using a multi-electron beam exposure apparatus is corrected. The electron beam exposure apparatus has an elementary electron optical system array for generating a plurality of electron beams in accordance with the pattern to be exposed, a reduction electron optical system for imaging the electron beams coming from the elementary electron optical system array, a deflector for deflecting the electron beams, and a focal point/astigmatism control circuit for correcting the imaging positions of the electron beams in units of settling positions of the electron beams on the basis of correction data corresponding to the pattern to be exposed.

50 Claims, 17 Drawing Sheets

FIG. 7

| SEQUENTIAL NO. | MATRIX POSITION | BLANKING CONTROL | | | | |
|---|---|---|---|---|---|---|
| | | A1(1, 1) | A1(1, 2) | A1(1, 3) | ... | A5(3, 9) |
| 1 | (x, y) | on or off | on or off | on or off | ... | on or off |
| 2 | (x, y) | on or off | on or off | on or off | ... | on or off |
| ... | ... | ... | ... | ... | | ... |
| n | (x, y) | on or off | on or off | on or off | ... | on or off |

FIG. 9

| SEQUENTIAL NO. | MATRIX POSITION | DISTRIBUTION COEFFICIENT FOR EACH SUBARRAY | | | | |
|---|---|---|---|---|---|---|
| | | A1 | A2 | A3 | A4 | A5 |
| 1 | (x, y) | C1(1) | C2(1) | C3(1) | C4(1) | C5(1) |
| 2 | (x, y) | C1(2) | C2(2) | C3(2) | C4(2) | C5(2) |
| ..... | ..... | ..... | ..... | ..... | ..... | ..... |
| n | (x, y) | C1(n) | C2(n) | C3(n) | C4(n) | C5(n) |

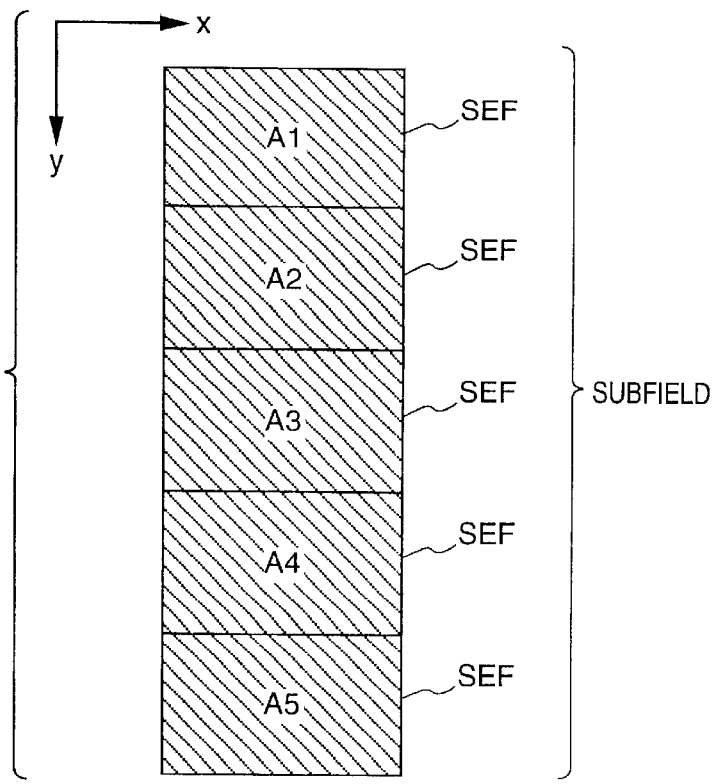
F I G. 11A
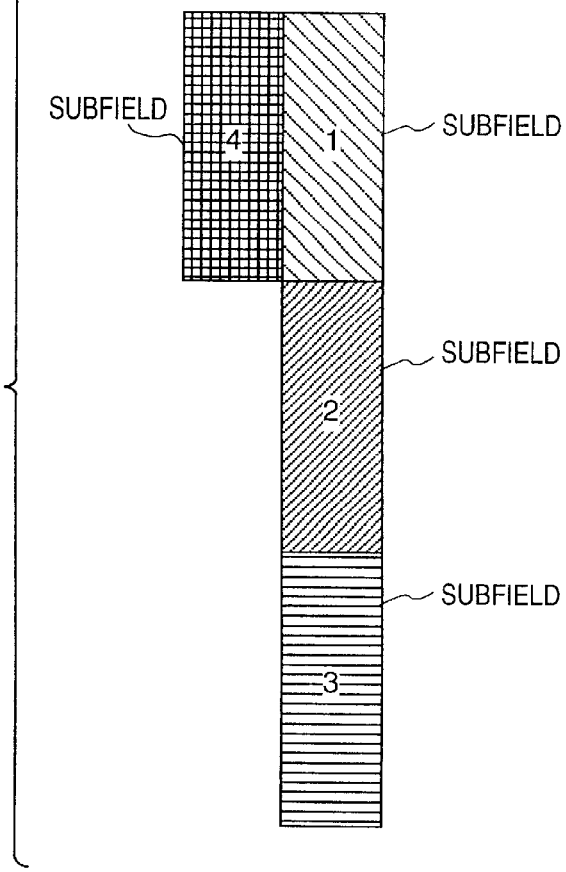
F I G. 11B

SEMICONDUCTOR DEVICE MANUFACTURING FLOW

FIG. 17

| SEQUENTIAL NO. | MATRIX POSITION | DISTRIBUTION COEFFICIENT |
|---|---|---|
| 1 | (x, y) | C1 |
| 2 | (x, y) | C2 |
| ⋮ | ⋮ | ⋮ |
| n | (x, y) | Cn |

ELECTRON BEAM EXPOSURE APPARATUS

BACKGROUND OF THE INVENTION

1. Field of the Invention

The present invention relates to an electron beam exposure apparatus and, more particularly, to an electron beam exposure apparatus for drawing a pattern on a wafer or drawing a pattern on a mask or reticle using a plurality of electron beams.

2. Description of the Related Art

In an electron beam exposure apparatus which performs exposure by imaging an electron beam on a substrate, when the beam current is large, the electron beam image projected onto the substrate is blurred due to a Coulomb effect. Most of blurring caused by the Coulomb effect can be corrected by re-adjusting the focal point position of a reduction electron optical system for projecting an electron beam, but some blurring remains uncorrected. In a variable shaping exposure apparatus which shapes the sectional shape of an electron beam within a maximum range of about 10 $\mu$m×10 $\mu$m, the blurring produced by the Coulomb effect is predicted from the area of the shaped beam, and apparatus parameters (beam current density, half beam incident angle, beam acceleration voltage, and optical length of the reduction electron optical system), and the focal point of the reduction electron optical system is adjusted in accordance with the prediction result.

In a multi-electron beam exposure apparatus which irradiates an array of a plurality of electron beams in line onto a substrate, deflects these electron beams to scan the substrate, and draws a pattern by ON/OFF-controlling the electron beams to be irradiated in correspondence with the pattern to be drawn, since the electron beams are dispersed i.e., since the effective current density per unit area on the substrate is low, blurring due to the Coulomb effect is small. This means that when the blurring due to the Coulomb effect is confined within a predetermined value, the multi-electron beam exposure apparatus can improve the exposure throughput by applying larger beam currents than the variable shaping exposure apparatus.

SUMMARY OF THE INVENTION

It is an object of the present invention to allow high-resolution pattern drawing by appropriately correcting an electron beam image blurred due to the Coulomb effect.

An electron beam exposure apparatus according to one aspect of the present invention is an electron beam exposure apparatus for forming a pattern on a substrate by exposure using a plurality of electron beams, comprising an electron beam source for generating a plurality of electron beams in accordance with a pattern to be exposed, a reduction electron optical system for imaging an electron beam group emitted by the electron beam source on the substrate, a scanning unit for scanning the electron beam group on the substrate, and a correction unit for correcting imaging positions of the electron beam group on the basis of correction data corresponding to the pattern to be exposed.

In the electron beam exposure apparatus, the correction unit preferably corrects the imaging positions of the electron beam group on the basis of correction data corresponding to the number of electron beams that make up the electron beam group emitted by the electron beam source.

In the electron beam exposure apparatus, the correction unit preferably corrects the imaging positions of the electron beam group on the basis of correction data corresponding to a distribution of electron beams that make up the electron beam group emitted by the electron beam source.

In the electron beam exposure apparatus, the correction unit preferably adjusts a focal point position of the reduction electron optical system on the basis of the correction data.

In the electron beam exposure apparatus, the electron beam source preferably comprises an electron source, a plurality of elementary electron optical systems for forming intermediate images of the electron source, and a control unit for controlling whether each of the plurality of elementary electron optical systems forms an intermediate image of the electron source.

In the electron beam exposure apparatus, the correction unit preferably adjusts imaging positions of the intermediate images in an axial direction of the reduction electron optical system on the basis of the correction data.

In the electron beam exposure apparatus, the correction unit preferably adjusts imaging positions of the intermediate images in an axial direction of the reduction electron optical system, and a focal point position of the reduction electron optical system on the basis of the correction data.

In the electron beam exposure apparatus, preferably, a subarray is formed by a matrix of a plurality of elementary electron optical systems and an entire array is formed by a matrix of a plurality of subarrays.

In the electron beam exposure apparatus, the correction unit preferably corrects imaging positions of the intermediate images in an axial direction of the reduction electron optical system in units of subarrays on the basis of the correction data.

In the electron beam exposure apparatus, preferably, the correction unit commonly corrects imaging positions of electron beams coming from all the elementary electron optical systems of the entire array by adjusting a focal point position of the reduction electron optical system on the basis of the correction data, and adjusts imaging positions of the intermediate images in an axial direction of the reduction electron optical system in units of subarrays on the basis of differences between the common correction amount and appropriate correction amounts.

In the electron beam exposure apparatus, preferably, the scanning unit comprises a main deflector and sub deflector for deflecting electron beams emitted by the electron beam source, the scanning unit divides an exposure region on the substrate into a plurality of fields, switches the field to be exposed by the main deflector, and scans the electron beam group in each field using the sub deflector, and a constant correction amount for imaging positions of the electron beam group is maintained while a pattern is drawn on each field.

In the electron beam exposure apparatus, the correction unit preferably dynamically corrects imaging positions of the electron beam group emitted by the electron beam source on the basis of the correction data.

In the electron beam exposure apparatus, the correction unit preferably corrects the imaging positions of the electron beam group on the basis of the correction data each time a positional relationship between the electron beam group emitted by the electron beam source and the substrate is settled.

In the electron beam exposure apparatus, the correction data is preferably a function having, as variables, at least the number of electron beams coming from the subarray corresponding to an object to be corrected, a distance between the subarray corresponding to the object to be corrected, and another subarray that outputs the electron beams, and the number of electron beams coming from the other subarray.

In the electron beam exposure apparatus, the correction data is preferably a function having, as a variable, at least a spacing of electron beams emitted by the electron source.

The electron beam exposure apparatus preferably further comprises a calculation unit for generating correction data used for correcting imaging positions of the electron beam group on the basis of data that defines the pattern to be exposed on the substrate.

An electron beam exposure method according to another aspect of the present invention is an electron beam exposure method for forming a pattern on a substrate by exposure using a plurality of electron beams, comprising the steps of: imaging a plurality of electron beams, which are emitted by an electron beam source in accordance with a pattern to be exposed, via a reduction electron optical system, and scanning the electron beam group on the substrate; and correcting imaging positions of the electron beam group on the basis of correction data corresponding to the pattern to be exposed in synchronism with the scan.

In the electron beam exposure method, the correction step preferably includes the step of correcting the imaging positions of the electron beam group on the basis of correction data corresponding to the number of electron beams that make up the electron beam group emitted by the electron beam source.

In the electron beam exposure method, the correction step preferably includes the step of correcting the imaging positions of the electron beam group on the basis of correction data corresponding to a distribution of electron beams that make up the electron beam group emitted by the electron beam source.

In the electron beam exposure method, the correction step preferably includes the step of adjusting a focal point position of the reduction electron optical system on the basis of the correction data.

In the electron beam exposure method, the electron beam source preferably comprises an electron source, a plurality of elementary electron optical systems for forming intermediate images of the electron source, and a control unit for controlling whether each of the plurality of elementary electron optical systems forms an intermediate image of the electron source.

In the electron beam exposure method, the correction step preferably includes the step of adjusting imaging positions of the intermediate images in an axial direction of the reduction electron optical system on the basis of the correction data.

In the electron beam exposure method, the correction step includes the step of adjusting imaging positions of the intermediate images in an axial direction of the reduction electron optical system, and a focal point position of the reduction electron optical system on the basis of the correction data.

In the electron beam exposure method, preferably, a subarray is formed by a matrix of a plurality of elementary electron optical systems and an entire array is formed by a matrix of a plurality of subarrays.

In the electron beam exposure method, the correction step preferably includes the step of correcting imaging positions of the intermediate images in an axial direction of the reduction electron optical system in units of subarrays on the basis of the correction data.

In the electron beam exposure method, the correction step preferably includes the step of commonly correcting imaging positions of electron beams coming from all the elementary electron optical systems of the entire array by adjusting a focal point position of the reduction electron optical system on the basis of the correction data, and adjusting imaging positions of the intermediate images in an axial direction of the reduction electron optical system in units of subarrays on the basis of differences between the common correction amount and appropriate correction amounts.

In the electron beam exposure method, preferably, an exposure region on the substrate is divided into a plurality of fields, the field to be exposed is switched by a main deflector, and the electron beam group in each field is scanned using a sub deflector, and a constant correction amount for imaging positions of the electron beam group is maintained while a pattern is drawn on each field.

In the electron beam exposure method, the correction step preferably includes the step of dynamically correcting imaging positions of the electron beam group emitted by the electron beam source on the basis of the correction data.

In the electron beam exposure method, the correction step preferably includes the step of correcting the imaging positions of the electron beam group on the basis of the correction data each time a positional relationship between the electron beam group emitted by the electron beam source and the substrate is settled.

In the electron beam exposure method, the correction data is preferably a function having, as variables, at least the number of electron beams coming from the subarray corresponding to an object to be corrected, a distance between the subarray corresponding to the object to be corrected, and another subarray that outputs the electron beams, and the number of electron beams coming from the other subarray.

In the electron beam exposure method, the correction data is preferably a function having, as a variable, at least a spacing of electron beams emitted by the electron beam source.

The electron beam exposure method preferably further comprises the calculation step of generating correction data used for correcting imaging positions of the electron beam group on the basis of data that defines the pattern to be exposed on the substrate.

A data generation method according to still another aspect of the present invention is a method of generating data for controlling the above-mentioned electron beam exposure apparatus, comprising the steps of: inputting data that defines a pattern to be exposed on a substrate; and generating correction data used for correcting imaging positions of an electron beam group on the basis of the input data.

In the data generation method, the correction data generation step preferably includes the step of generating the correction data on the basis of the number of electron beams that make up the electron beam group emitted by an electron beam source.

In the data generation method, the correction data generation step preferably includes the step of generating the correction data on the basis of a distribution of electron beams that make up the electron beam group emitted by an electron beam source.

In the data generation method, the correction data generation step preferably includes the step of generating the correction data for correcting the imaging positions of the electron beam group when a positional relationship between the electron beam group and the substrate is settled.

A computer readable program according to yet another aspect of the present invention is a computer readable program for generating data for controlling the above-mentioned electron beam exposure apparatus, comprising the steps of: inputting data that defines a pattern to be exposed on a substrate; and generating correction data used for correcting imaging positions of an electron beam group on the basis of the input data.

In the computer readable program, the correction data generation step preferably includes the step of generating the correction data on the basis of the number of electron beams that make up the electron beam group emitted by an electron beam source.

In the computer readable program, the correction data generation step preferably includes the step of generating the correction data on the basis of a distribution of electron beams that make up the electron beam group emitted by an electron beam source.

In the computer readable program, the correction data generation step preferably includes the step of generating the correction data for correcting the imaging positions of the electron beam group when a positional relationship between the electron beam group and the substrate is settled.

Further objects, features and advantages of the present invention will become apparent from the following detailed description of embodiments of the present invention with reference to the accompanying drawings.

BRIEF DESCRIPTION OF THE DRAWINGS

FIG. 7 is a view for explaining exposure control data;

FIG. 9 is a view for explaining refocus control data;

FIGS. 11A and 11B are views for explaining subfields;

FIG. 17 is a view for explaining evaluation according to the second correction method.

DETAILED DESCRIPTION OF THE PREFERRED EMBODIMENT

An exposure apparatus according to this embodiment is a multi-electron beam exposure apparatus which draws a desired pattern by irradiating a plurality of electron beams onto a substrate via an electron optical system, and adjusts the focal point of the electron optical system in correspondence with the number of electron beams irradiated onto the substrate, which sequentially changes in accordance with the pattern to be drawn. With this apparatus, an electron beam image blurred by the Coulomb effect can be corrected, and a pattern can be drawn at high resolution.

In the multi-electron beam exposure apparatus, a plurality of electron beams irradiated onto the substrate are concentrated on a narrow range or uniformly distributed depending on the pattern to be drawn. Even when the number of electron beams irradiated onto the substrate remains the same, since the former case has a higher effective current density per unit area than the latter case, an electron beam image is blurred larger by the Coulomb effect.

Figure 14A:
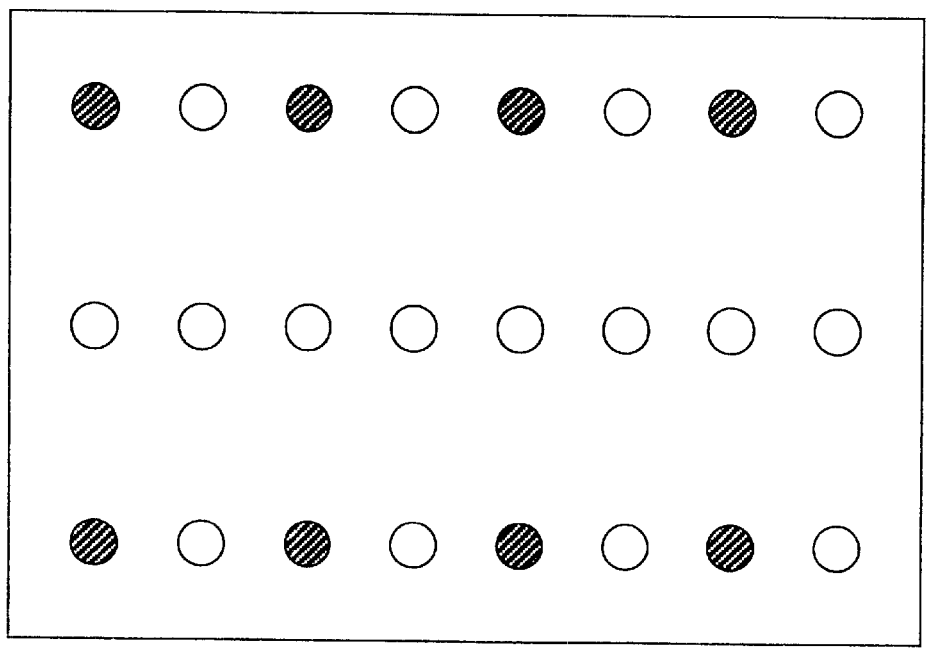
FIGS. 14A and 14B are views for explaining blurring produced by the Coulomb effect.
Figure 14B:
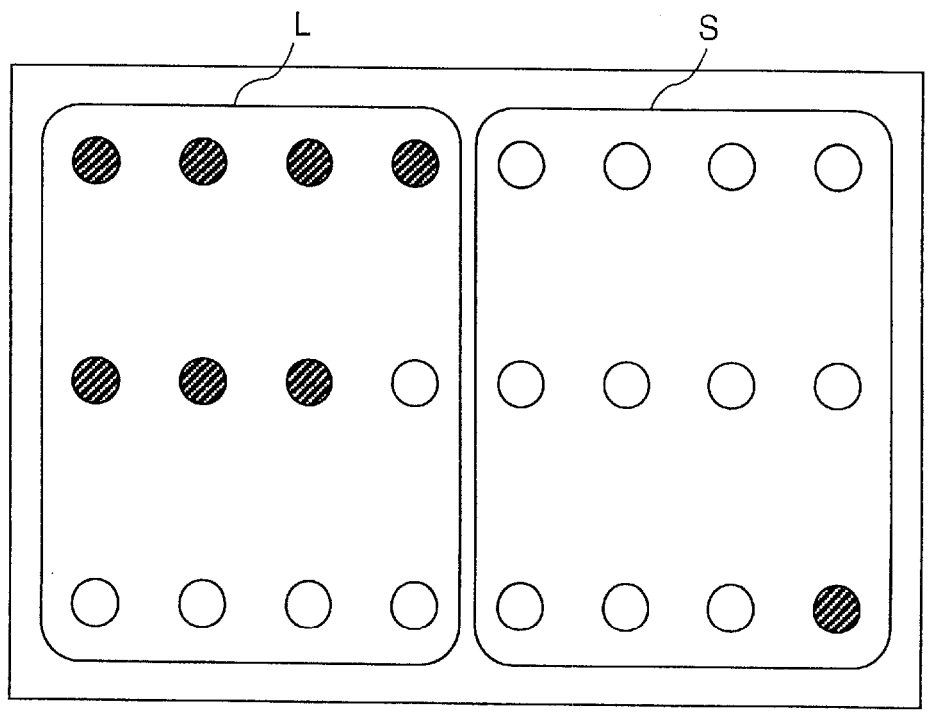

FIGS. 14A and 14B exemplify the patterns to be drawn on the substrate. In FIGS. 14A and 14B, the full circles indicate the actual irradiation positions of the electron beams, and the open circles indicate non-irradiation positions of the electron beams. The patterns shown in FIGS. 14A and 14B have the same number of electron beams to be irradiated onto the substrate (equivalent to the sum total of currents irradiated onto the substrate). However, in a region L in FIG. 14B, an electron beam image is blurred larger due to the Coulomb effect since a plurality of electron beams are concentrated within a narrower range than in FIG. 14A. On the other hand, in a region S in FIG. 14B, an electron beam image is blurred less due to the Coulomb effect since the electron beam density irradiated is smaller than that in FIG. 14A.

Figure 15A:
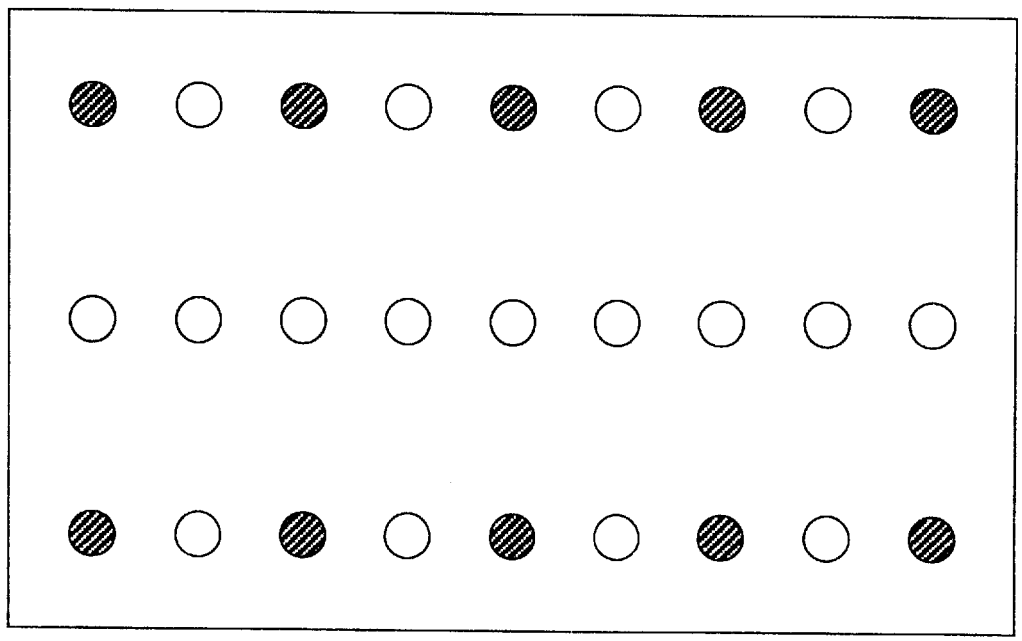
FIGS. 15A and 15B are views for explaining blurring produced by the Coulomb effect.
Figure 15B:
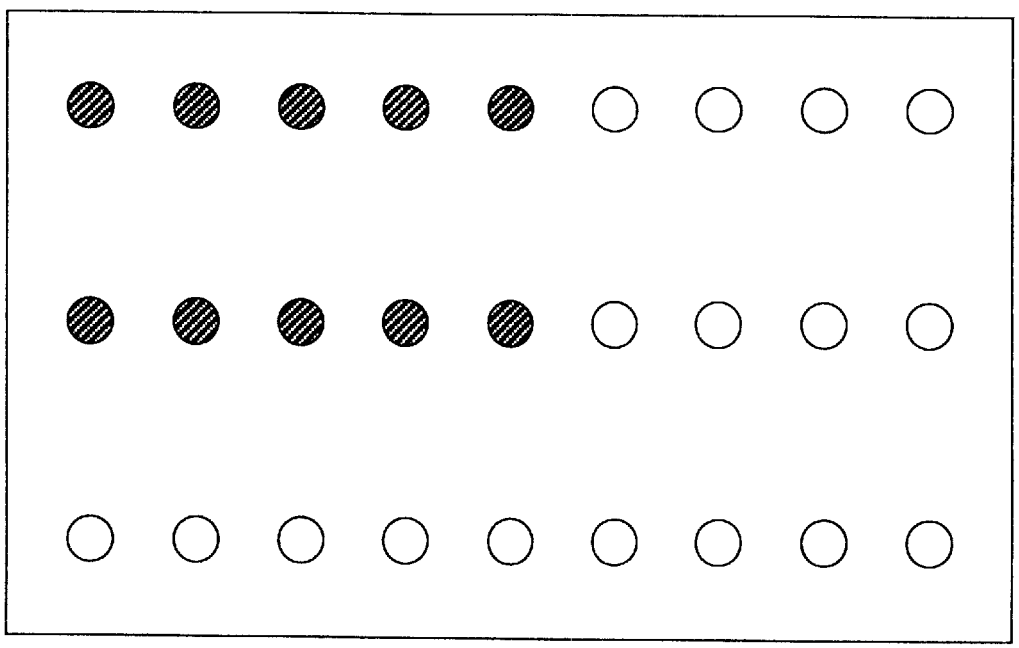

The different degrees of blurring of an electron beam image due to the Coulomb effect arising from the distribution of electron beams irradiated onto the substrate also apply to, e.g., the patterns shown in FIGS. 15A and 15B.

Hence, in order to accurately correct blurring of an electron beam due to the Coulomb effect, not only the number of electron beams to be irradiated onto the substrate (the sum total of currents irradiated onto the substrate) but also the distribution of electron beams are preferably taken into consideration.

In the following description, an electron beam exposure apparatus which adjusts the focal point of an electron optical system in consideration of not only the number of electron beams to be irradiated onto the substrate but also the distribution of electron beams will be disclosed as a preferred embodiment of the present invention.

(Explanation of Constituting Elements of Electron Beam Exposure Apparatus)

Figure 1:
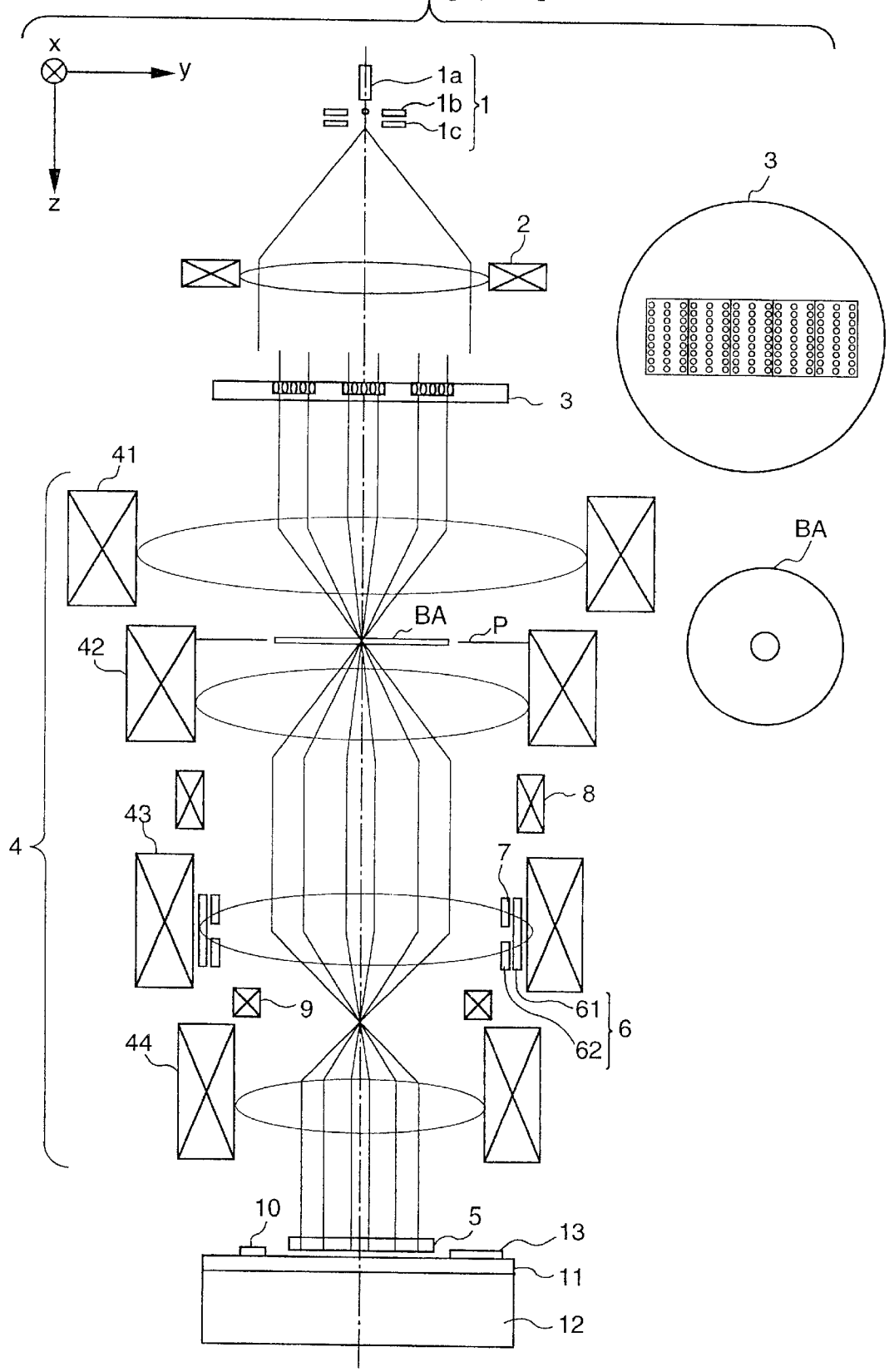
FIG. 1 is a schematic view showing the principal part of an electron beam exposure apparatus according to the present invention.

FIG. 1 is a schematic view showing the principal part of an electron beam exposure apparatus according to the present invention.

Referring to FIG. 1, reference numeral 1 denotes an electron gun made up of a cathode 1a, grid 1b, and anodes 1c. Electrons emitted by the cathode 1a form a crossover image between the grid 1b and anode 1c. The crossover image will be referred to as an electron source hereinafter.

Electrons coming from this electron source are converted into nearly collimated electron beams by a condenser lens 2 whose front-side focal point position is located at the electron source position. The nearly collimated electron beams enter an elementary electron optical system array 3. The elementary electron optical system array 3 is formed by arranging a plurality of elementary electron optical systems, each consisting of an aperture, an electron optical system, and a blanking electrode, in directions perpendicular to an optical axis AX. The elementary electron optical system 3 will be explained in detail later.

The elementary electron optical system array 3 forms a plurality of intermediate images of the electron source. These intermediate images are projected in a reduced scale by a reduction electron optical system 4 (to be described later), and form images of the electron source on a wafer 5.

In this case, the individual elements of the elementary electron optical system array 3 are set so that the spacing between adjacent electron source images formed on the wafer 5 equals an integer multiple of the size of each electron source image. Furthermore, the elementary electron optical system array 3 makes the positions of the individual intermediate images differ in the optical axis direction in correspondence with the curvature of field of the reduction electron optical system 4, and corrects in advance any aberrations expected to be produced when the individual intermediate images are projected onto the wafer 5 in a reduced scale by the reduction electron optical system 4.

The reduction electron optical system 4 comprises a symmetric magnetic doublet consisting of a first projection lens 41 (43) and second projection lens 42 (44). If f1 represents the focal length of the first projection lens 41 (43), and f2 represents the focal length of the second projection lens 42 (44), the distance between these two lenses is f1+f2. The object point on the optical axis AX is located at the focal point position of the first projection lens 41 (43), and its image point is formed at the focal point of the second projection lens 42 (44). This image is reduced to −f2/f1. Since two lens magnetic fields are determined to act in opposite directions, the Seidel aberrations and chromatic aberrations pertaining to rotation and magnification theoretically cancel each other, except for five aberrations, i.e., spherical aberration, isotropic astigmatism, isotropic coma, curvature of field, and on-axis chromatic aberration.

Reference numeral 6 denotes a deflector for deflecting a plurality of electron beams coming from the elementary electron optical system array 3 to displace a plurality of electron source images by nearly equal displacement amounts in the X- and Y-directions on the wafer 5. The deflector 6 comprises a main deflector 61 used when the deflection width is large, and a sub deflector 62 used when the deflection width is small. The main deflector 61 is an electromagnetic type deflector, and the sub deflector 62 is an electrostatic type deflector.

Reference numeral 7 denotes a dynamic focus coil that corrects any deviations of the focus positions of the electron source images arising from deflection aberration produced upon operation of the deflector 6; and 8, a dynamic stigmatic coil that corrects astigmatism of deflection aberration produced upon deflection as in the dynamic focus coil 7.

Reference numeral 9 denotes a refocus coil for adjusting the focal point position of the reduction electron optical system 4 to correct blurring of electron beams due to the Coulomb effect produced when the number of a plurality of electron beams to be irradiated onto a wafer or the sum total of currents to be irradiated onto the wafer becomes large.

Reference numeral 10 denotes a Faraday cup having two single knife edges respectively extending in the X- and Y-directions. The Faraday cup detects the charge amount of images formed by the electron beams coming from the elementary electron optical systems.

Reference numeral 11 denotes a θ-Z stage that carries a wafer, and is movable in the direction of the optical axis AX (Z-axis) and in the direction of rotation about the Z-axis. A stage reference plate 13 and the Faraday cup 10 are fixed on the stage 11.

Reference numeral 12 denotes an X-Y stage which carries the θ-Z stage and is movable in the X- and Y-directions perpendicular to the direction of the optical axis AX (Z-axis).

Figure 2:
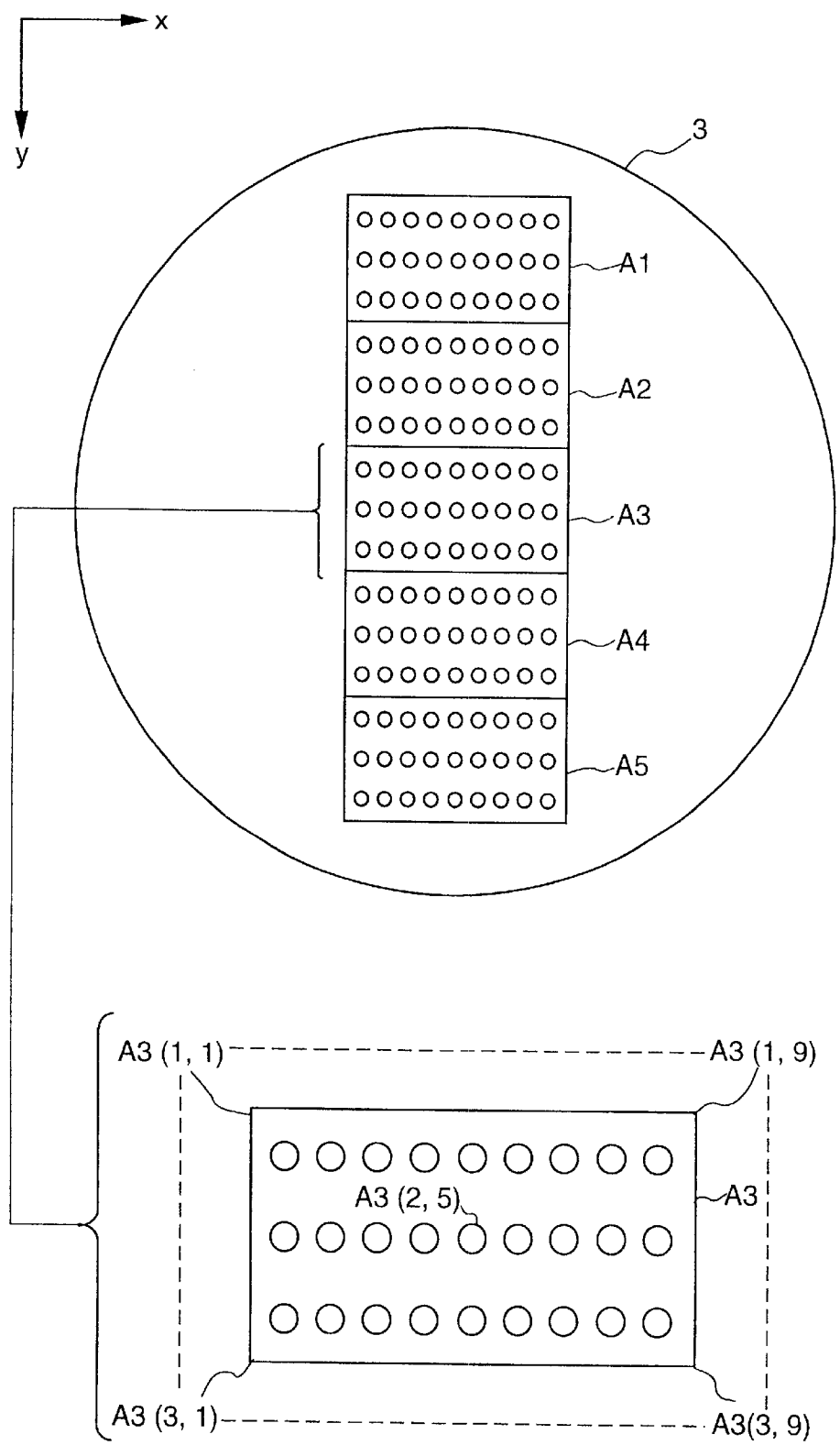
FIG. 2 is a view for explaining an elementary electron optical system array 3.

The elementary electron optical system array 3 will be explained below with reference to FIG. 2.

In the elementary electron optical system array 3, a plurality of elementary electron optical systems form a group (subarray), and a plurality of subarrays are formed. In this embodiment, five subarrays A1 to A5 are formed. In each subarray, a plurality of elementary electron optical systems are two-dimensionally arranged, and 27 elementary electron optical systems (e.g., A3 (1,1) to A3 (3,9)) are formed in each subarray of this embodiment.

Figure 3:
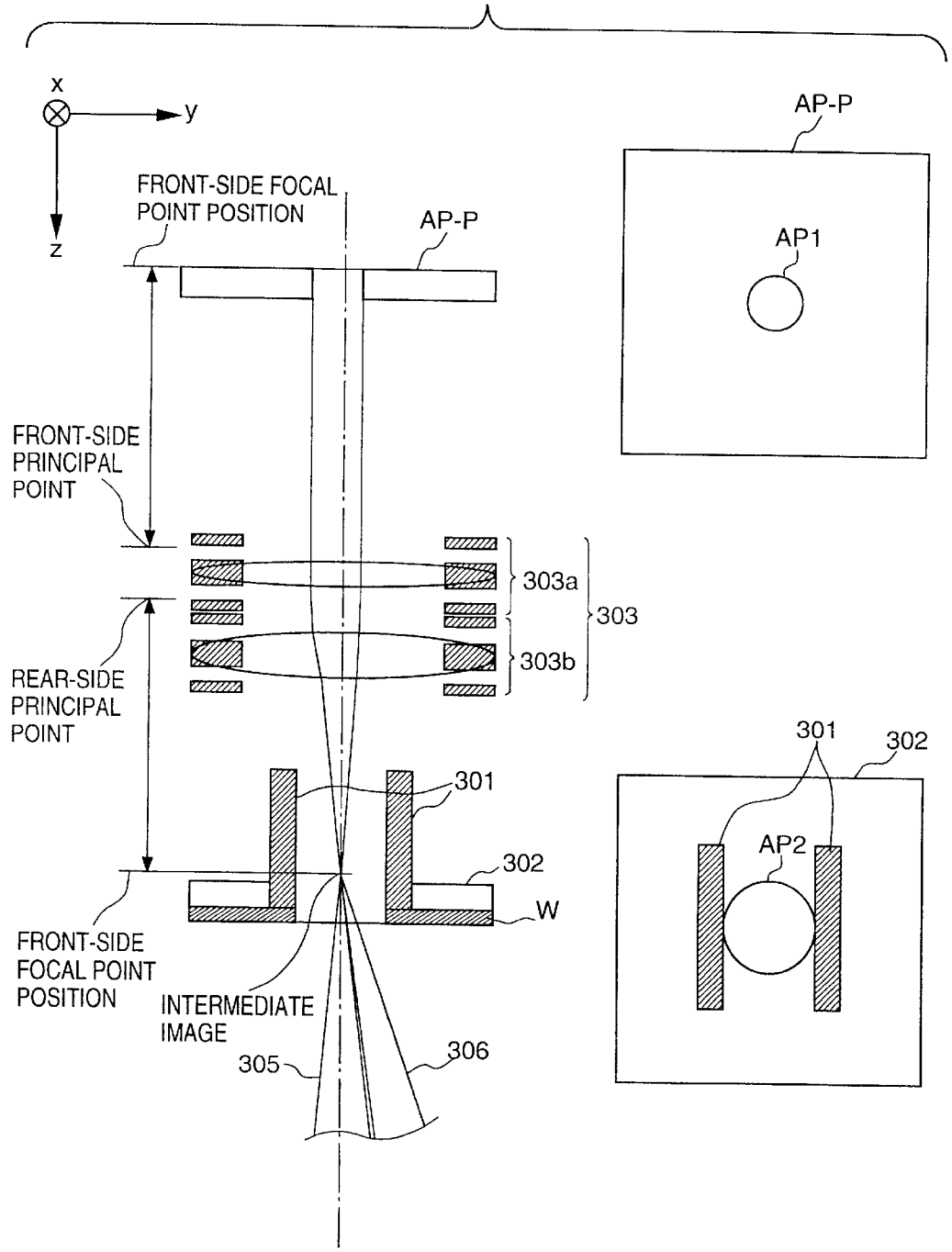
FIG. 3 is a sectional view for explaining an elementary electron optical system.

FIG. 3 is a sectional view of each elementary electron optical system.

Referring to FIG. 3, a substrate AP-P is irradiated with electron beams nearly collimated by the condenser lens 2. The substrate AP-P has an aperture (AP1) that defines the shape of electron beams to be transmitted, and is common to other elementary electron optical systems. That is, the substrate AP-P is a substrate having a plurality of apertures.

Reference numeral 301 denotes a blanking electrode which is made up of a pair of electrodes and has a deflection function; and 302, a substrate which has an aperture (AP2) and is common to other elementary electron optical systems. On the substrate 302, the blanking electrode 301 and a wiring layer (W) for turning on/off the electrodes are formed. That is, the substrate 302 has a plurality of apertures and a plurality of blanking electrodes.

Reference numeral 303 denotes an electron optical system, which uses two unipotential lenses 303a and 303b. Each unipotential lens is made up of three aperture electrodes, and has a convergence function by setting the upper and lower electrodes at the same potential as an acceleration potential V0, and keeping the intermediate electrode at another potential V1 or V2. The individual aperture electrodes are stacked on a substrate via insulating materials, and the substrate is common to other elementary electron optical systems. That is, the substrate has a plurality of electron optical systems 303.

Figure 4A:
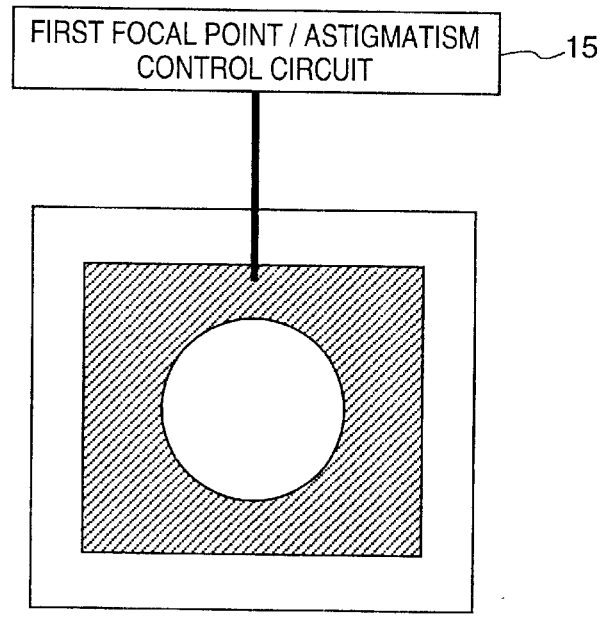
FIGS. 4A and 4B are views for explaining the electrodes of the elementary electron optical system.

The upper, intermediate, and lower electrodes of the unipotential lens 303a and the upper and lower electrodes of the unipotential lens 303b have a shape shown in FIG. 4A, and the upper and lower electrodes of the unipotential lenses 303a and 303b are set at common potential in all the elementary electron optical systems by a first focal point/astigmatism control circuit 15 (to be described later).

Since the potential of the intermediate electrode of the unipotential lens 303a can be set by the first focal point/astigmatism control circuit 15 in units of elementary electron optical systems, the focal length of the unipotential lens 303a can be set in units of elementary electron optical systems.

Figure 4B:
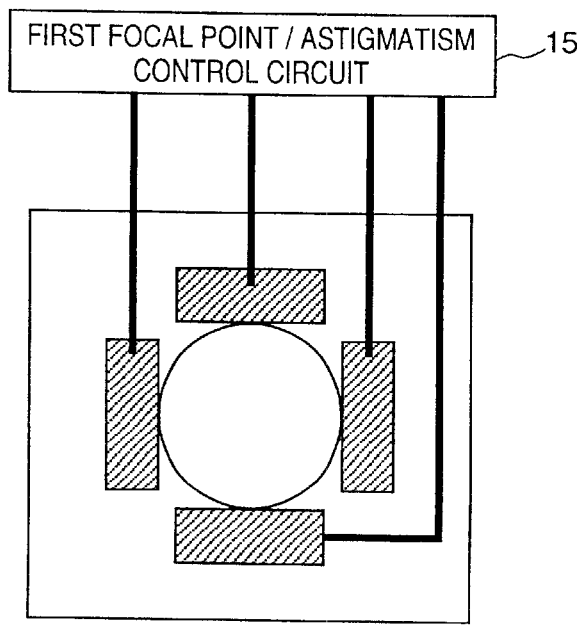

The intermediate electrode of the unipotential lens 303b is made up of four electrodes, as shown in FIG. 4B, and the potentials of these electrodes can be set independently and also individually in units of elementary electron optical systems by the first focal point/astigmatism control circuit 15. Hence, the unipotential lens 303b can have different focal lengths in a section perpendicular to its optical axis and can set them individually in units of elementary electron optical systems.

As a consequence, by respectively controlling the potentials of the intermediate electrodes of the electron optical systems 303, the electron optical characteristics (the intermediate image forming positions and astigmatism) of the elementary electron optical systems can be controlled. Upon controlling the intermediate image forming positions, since the size of each intermediate image is determined by the ratio between the focal lengths of the condenser lens 2 and each electron optical system 303, the intermediate image forming position is moved by setting a constant focal length of each electron optical system 303 and moving its principal point position. With this control, the intermediate images formed by all the elementary electron optical systems can have nearly equal sizes and different positions in the optical axis direction.

Each nearly collimated electron beam output from the condenser lens 2 forms an intermediate image of the electron source via the aperture (AP1) and electron optical system 303. Note that the aperture (AP1) is located at or in the vicinity of the front-side focal point position of the corresponding electron optical system 303, and the blanking electrode 301 is located at or in the vicinity of the intermediate image forming position (rear-side focal point position) of the corresponding electron optical system 303. For this reason, if no electric field is applied across the electrodes of the blanking electrode 301, the electron beam is not deflected, as indicated by an electron beam 305 in FIG. 3. On the other hand, if an electric field is applied across the electrodes of the blanking electrode 301, the electron beam is deflected, as indicated by an electron beam 306 in FIG. 3. Since the electron beams 305 and 306 have different angle distributions on the object plane of the reduction electron optical system 4, they become incident on different regions at the pupil position (on a plane P in FIG. 1) of the reduction electron optical system 4. Hence, a blanking aperture BA that transmits the electron beam 305 alone is formed at the pupil position (on the plane P in FIG. 1) of the reduction electron optical system.

The electron optical systems 303 of the elementary electron optical systems individually set the potentials of their two intermediate electrodes so as to correct the curvature of field and astigmatism produced when the intermediate images formed thereby are projected in a reduced scale onto the surface to be exposed by the reduction electron optical system 4, thereby making the electron optical characteristics (intermediate image forming positions and astigmatism) of the elementary electron optical systems different. However, in this embodiment, in order to decrease the number of wiring lines between the intermediate electrodes and the first focal point/astigmatism control circuit 15, the elementary electron optical systems included in a single subarray have identical electron optical characteristics, and the electron optical characteristics (intermediate image forming positions and astigmatism) of the elementary electron optical systems are controlled in units of subarrays.

Furthermore, in order to correct distortion produced when a plurality of intermediate images are projected in a reduced scale onto the surface to be exposed by the reduction electron optical system 4, the distortion characteristics of the reduction electron optical system 4 are detected in advance, and the positions of the elementary electron optical systems in the direction perpendicular to the optical axis of the reduction electron optical system 4 are set based on the detected characteristics.

Figure 5:
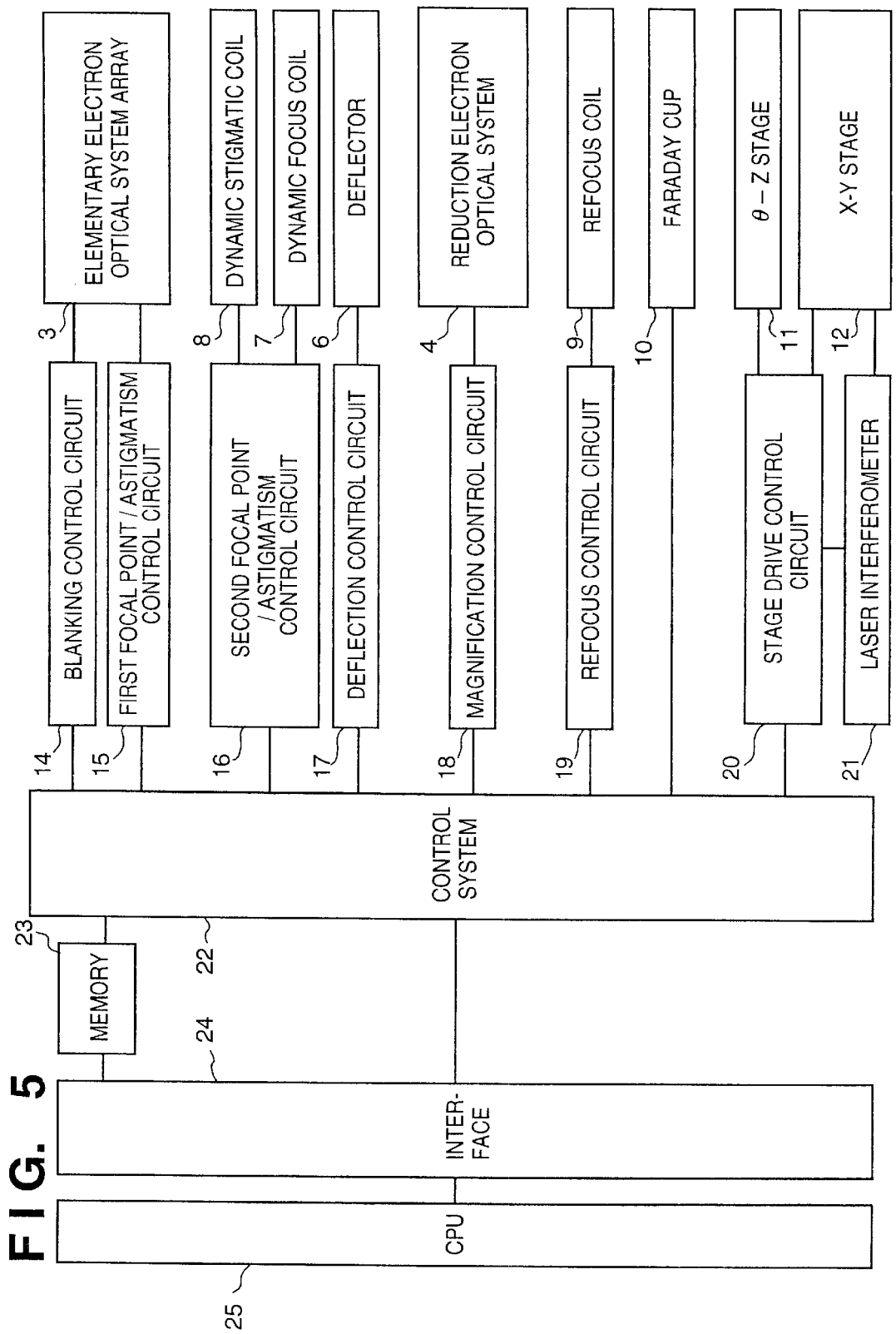
FIG. 5 is a block diagram for explaining the system arrangement according to the present invention.

FIG. 5 shows the system arrangement of this embodiment.

A blanking control circuit 14 individually ON/OFF-controls the blanking electrodes of the elementary electron optical systems in the elementary electron optical system array 3, and the first focal point/astigmatism control circuit 15 individually controls the electron optical characteristics (intermediate image forming positions and astigmatism) of the elementary electron optical systems in the elementary electron optical system array 3.

A second focal point/astigmatism control circuit 16 controls the focal point position and astigmatism of the reduction electron optical system 4 by controlling the dynamic stigmatic coil 8 and dynamic focus coil 7. A deflection control circuit 17 controls the deflector 6. A magnification adjustment circuit 18 adjusts the magnification of the reduction electron optical system 4. A refocus control circuit 19 controls currents to be supplied to the refocus coil 9 to adjust the focal point position of the reduction electron optical system 4.

A stage drive control circuit 20 controls driving of the θ-Z stage, and also controls driving of the X-Y stage 12 in collaboration with a laser interferometer 21 that detects the position of the X-Y stage 12.

A control system 22 synchronously controls the plurality of control circuits described above and Faraday cup 10 to attain exposure and alignment based on exposure control data from a memory 23. The control system 22 is controlled by a CPU 25 for controlling the entire electron beam exposure apparatus via an interface 24.

(Explanation of Operation)

The operation of the electron beam exposure apparatus of this embodiment will be explained below with the aid of FIG. 5.

Upon reception of pattern data to be formed on the wafer by exposure, the CPU 25 determines the minimum deflection amount the sub deflector 62 gives to the electron beams, on the basis of the minimum line width, types of line widths, and shapes of the pattern to be formed on the wafer by exposure. The CPU 25 divides the pattern data into those in units of exposure regions of the individual elementary electron optical systems, sets a common matrix made up of matrix elements FME using the minimum deflection amount as a matrix spacing, and converts the divided pattern data into those expressed on the common matrix in units of elementary electron optical systems. The processing pertaining to pattern data upon exposure using two elementary electron optical systems a and b will be described below for the sake of simplicity.

Figure 6:
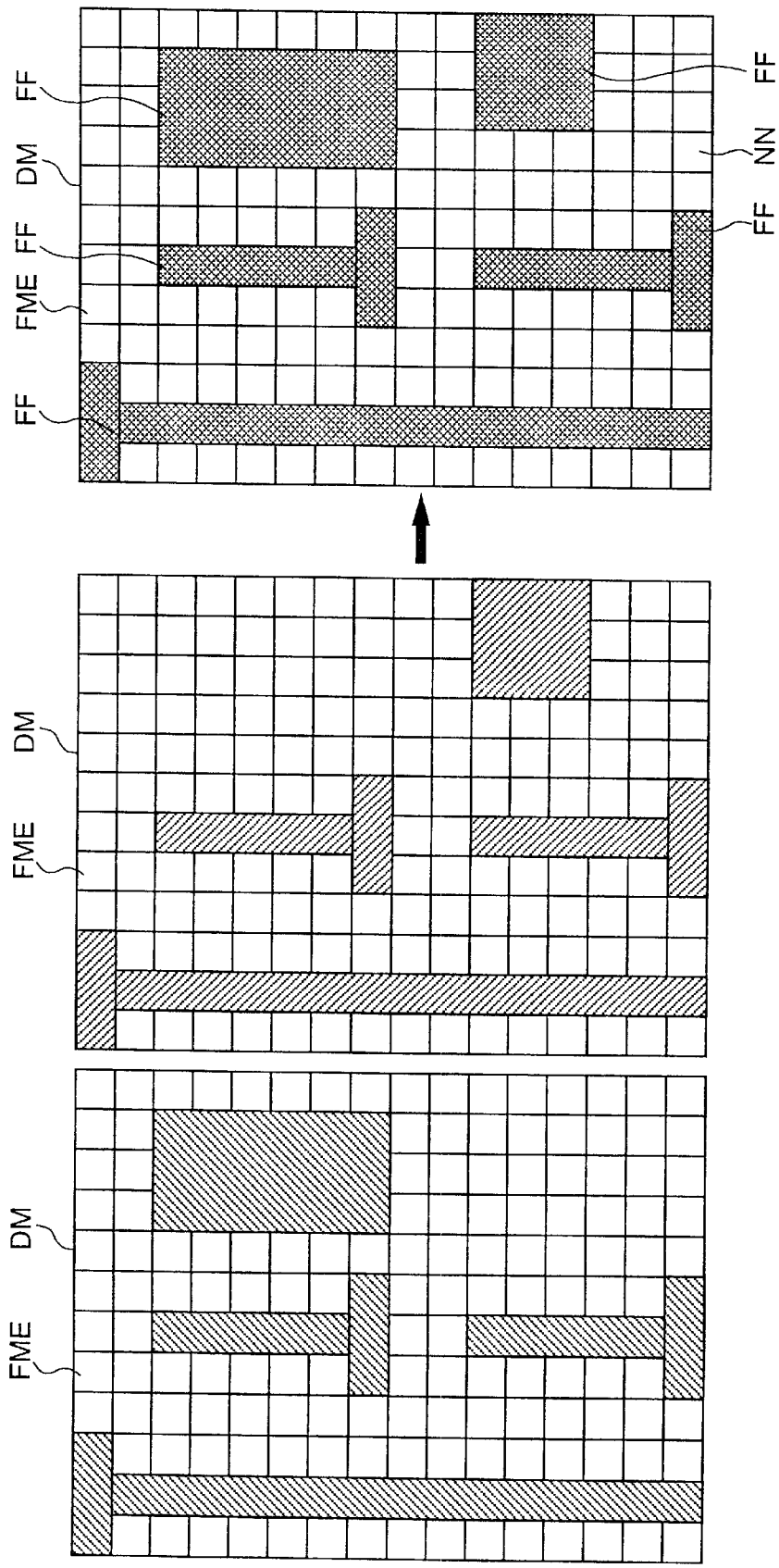
FIGS. 6A to 6C are views for explaining a process for determining the exposure patterns to be drawn by the respective elementary electron optical systems and the matrix regions defined by a deflector.

FIGS. 6A and 6B show patterns Pa and Pb to be exposed by the neighboring elementary electron optical systems a and b on a common deflection matrix DM. More specifically, each elementary electron optical system irradiates an electron beam onto the wafer by turning off its blanking electrode at matrix positions denoted by hatched pattern portions.

For this purpose, the CPU 25 determines first regions FF (solid black portions) consisting of the matrix positions corresponding to exposure positions of at least one of the elementary electron optical systems a and b, and second regions NN (blank portions) consisting of matrix positions where neither of the elementary electron optical systems a and b commonly perform exposure, as show in FIG. 6C, on the basis of the matrix position data to be exposed in units of elementary electron optical systems shown in FIGS. 6A and 6B.

When a plurality of electron beams are located on the first region FF on the matrix, exposure is done by deflecting the electron beams by the sub deflector 62 in units of minimum deflection amounts (the matrix spacings), thus forming all the patterns to be drawn on the wafer by exposure. When a plurality of electron beams are located on the second region NN on the matrix, they are deflected without settling their positions, thereby attaining exposure while eliminating unnecessary deflection of the electron beams.

Subsequently, the CPU 25 determines the matrix positions of matrix elements to be exposed on the basis of data pertaining to the regions FF and NN shown in FIG. 6C. Also, the CPU 25 determines the ON/OFF patterns of blanking electrodes corresponding to the matrix positions to be settled of the electron beams in units of elementary electron optical systems on the basis of data representing the patterns shown in FIGS. 6A and 6B.

Consequently, the CPU 25 forms exposure data including, as elements, the matrix positions to be exposed by at least one beam, and ON/OFF states of blanking electrodes of each elementary electron optical system at the matrix positions, as shown in FIG. 7.

Two examples that pertain to the method of correcting blurring produced by the Coulomb effect will be explained below.

(First Correction Method)

Figure 8:
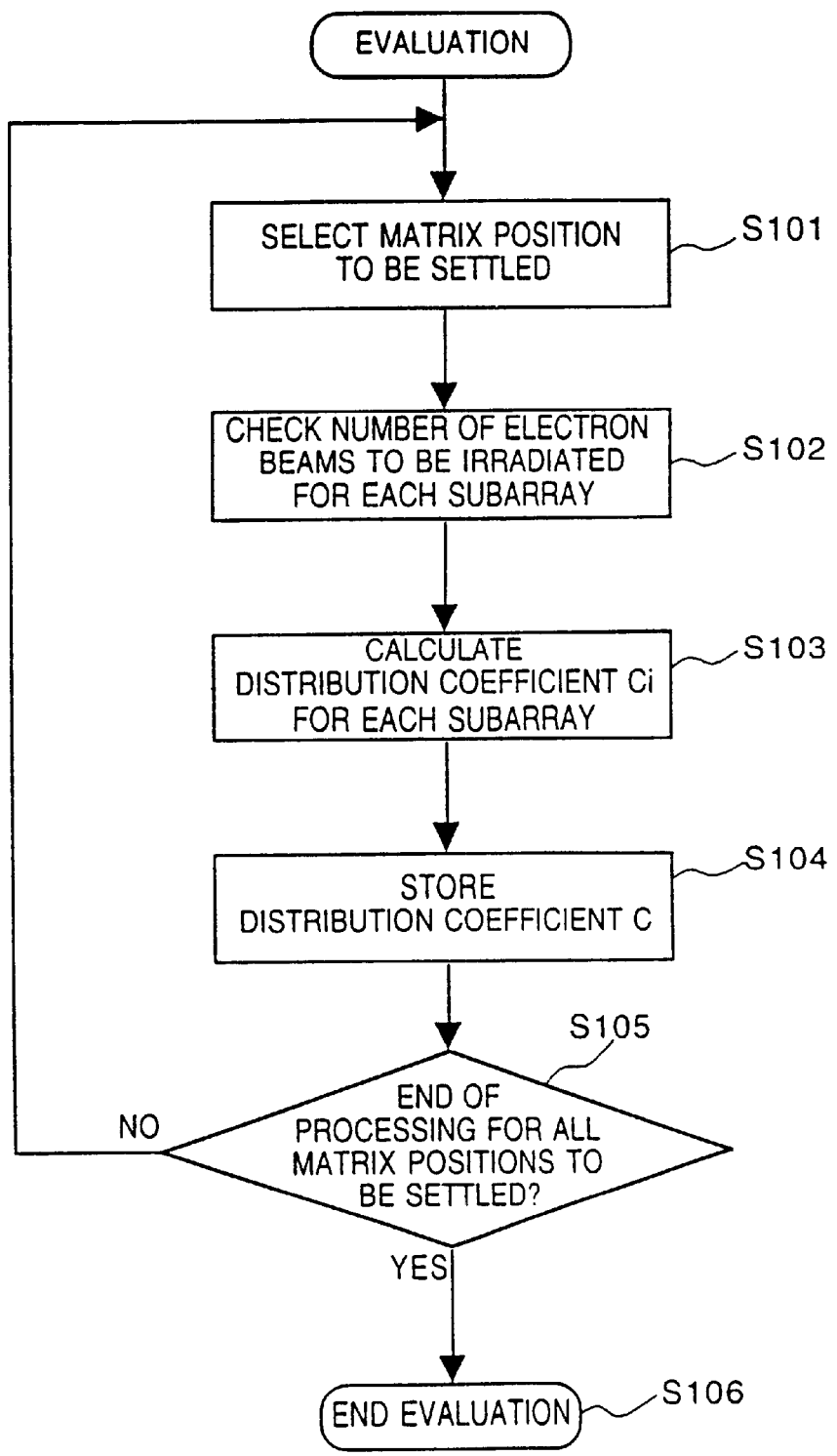
FIG. 8 is a flow chart for explaining evaluation according to the present invention.

The CPU 25 executes evaluation shown in FIG. 8 on the basis of the formed exposure control data so as to correct blurring produced by the Coulomb effect.

In the evaluation shown in FIG. 8, a distribution coefficient C for each subarray, which represents the distribution state of a plurality of electron beams irradiated onto the wafer, is calculated in the following sequence in units of matrix positions to be settled.

(Step S101)

The matrix position (x, y) to be settled is selected.

(Step S102)

The numbers N1 to N5 (the numbers of OFF blanking electrodes in subarrays) of electron beams that can reach the wafer without being intercepted in the subarrays A1 to A5 are checked. More specifically, the number of electron beams to be irradiated onto the wafer coming from each subarray, as an electron beam group made up of a plurality of electron beams, is checked.

(Step S103)

A distribution coefficient Ci for each subarray Ai is calculated by:

$$Ci = K \times Ni + \sum_{i=1, j \neq i}^{5} (Ni \times Nj)/(Di, j)^2$$

where Ni is the number of electron beams to be irradiated onto the wafer by the subarray Ai checked in step S102, K is a constant determined by, e.g., the size of the subarray, and Di,j is the distance between the centers of subarrays Ai and Aj.

With the above equation, even when the number of all electron beams to be irradiated onto the wafer remains the same, the distribution coefficient Ci of the subarray Ai becomes larger as the number of electron beams to be irradiated onto the wafer in the subarray Ai is larger. Even when the number of electron beams to be irradiated onto the wafer in the subarray Ai remains the same, the distribution coefficient Ai of the subarray Ci becomes larger if the number of electron beams in another subarray is large.

(Step S104)

The calculated distribution coefficients Ci in units of subarrays are stored as refocus control data.

(Step S105)

It is checked if the processing in steps S102 to S104 is complete for all the matrix positions (x, y) to be settled. If non-processed matrix positions (x, y) to be settled are found, the flow returns to step S101 to select the next non-processed matrix position (x, y).

(Step S106)

Upon completion of the above processing for all the matrix positions (x, y) to be settled, the evaluation shown in FIG. 8 ends, and refocus control data including distribution coefficients Ci in units of subarrays corresponding to the matrix positions to be settled is stored, as shown in FIG. 9.

In this embodiment, these processing steps are executed by the CPU 25 of the electron beam exposure apparatus. Alternatively, the above steps may be executed by another processing device, and the obtained exposure control data and refocus control data may be transferred to the CPU 25 to achieve the above object and to obtain the same effects as above.

The CPU 25 then instructs the control system 22 to "execute exposure" via the interface 24. In response to this instruction, the control system 22 executes the following steps on the basis of the data on the memory 23 that stores the exposure control data and refocus control data.

(Step S201)

The control system 22 directs the deflection control circuit 17 to deflect a plurality of electron beams coming from the elementary electron optical system array by the sub deflector 62 of the deflector 6 so as to settle their positions, on the basis of the exposure control data transferred from the memory 23 in synchronism with internal reference clocks.

The control system 22 directs the first focal point/astigmatism control circuit 15 to control the intermediate image forming positions of the elementary electron optical systems, in units of sub arrays, on the basis of the refocus control data transferred in the same manner as the exposure control data. More specifically, the control system 22 sets, on the basis of the distribution coefficients Ci in units of subarrays, the intermediate image forming positions of the elementary electron optical system of each subarray to be closer to the electron gun 1 side as the distribution coefficient Ci is larger. As a result, the imaging position of an electron beam on the wafer, which moves to a position farther from the reduction electron optical system 4 owing to the Coulomb effect as the distribution coefficient Ci is larger, approaches the reduction electron optical system 4, thus correcting blurring produced by the Coulomb effect. The moving amount (correction amount) of the imaging position of each electron beam on the wafer is called a refocus amount. The relationship between the refocus amount and distribution coefficient C is obtained in advance by numerical simulations or experiments, and the electron optical characteristics of the elementary electron optical systems in units of subarrays are controlled to obtain desired refocus amounts on the basis of the distribution coefficients C.

Furthermore, the control system 22 directs the blanking control circuit 14 to turn on/off the blanking electrodes of the elementary electron optical systems in correspondence with the pattern to be exposed. At this time, the X-Y stage 12 is continuously moving in the X-direction, and the deflection control circuit 17 controls the deflection positions of the electron beams in consideration of the moving amount of the X-Y stage 12.

Figure 10A:
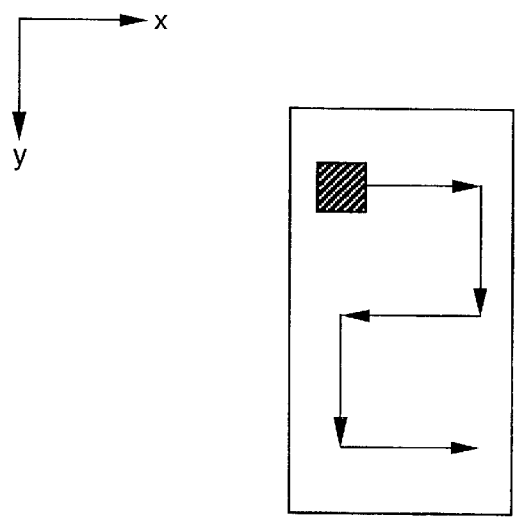
FIGS. 10A and 10B are views for explaining exposure fields (EF) and subarray exposure fields (SEF)
Figure 10B:
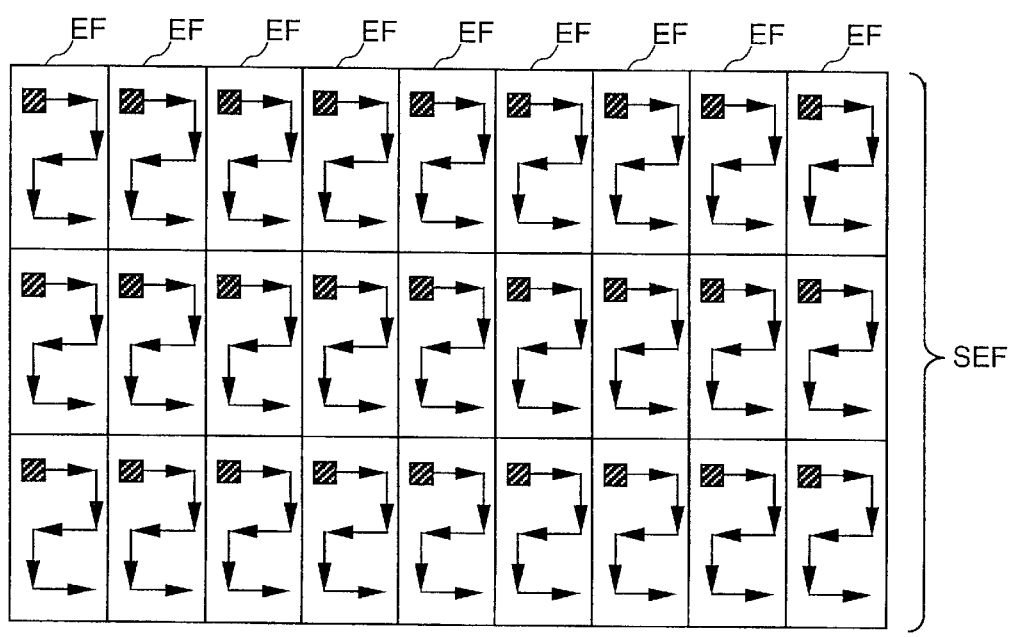

As a result, an electron beam coming from one elementary electron optical system scans and exposes an exposure field (EF) on the wafer 5 to have a full square as a start point, as shown in FIG. 10A. Also, as shown in FIG. 10B, the exposure fields (EF) of the plurality of elementary electron optical systems in each subarray are set adjacent to each other. Consequently, a subarray exposure field (SEF) including a plurality of exposure fields (EF) is exposed on the wafer 5. At the same time, a subfield made up of subarray exposure fields (SEF) respectively formed by the subarrays A1 to A5 is exposed on the wafer 5, as shown in FIG. 11A.

(Step S202)

The control system 22 directs the deflection control circuit 17 to deflect a plurality of electron beams coming from the elementary electron optical system array using the main deflector 61 of the deflector 6, so as to expose subfield 2 after subfield 1, as shown in FIG. 11B. At that time, the control system 22 directs the second focal point/astigmatism control circuit 16 to control the dynamic focus control 7 on the basis of dynamic focus correction data obtained in advance, and to control the dynamic stigmatic coil 8 on the basis of dynamic stigmatic correction data obtained in advance, thereby correcting astigmatism of the reduction electron optical system. Then, the control system 22 executes the operation in step S201 to expose subfield 2.

By repeating steps S201 and S202 above, subfields are sequentially exposed like subfields 3, 4, . . . , as shown in FIG. 11B, thereby exposing the entire surface of the wafer.

In the above-mentioned correction method, the refocus amount of electron beams for each subarray is set by adjusting the electron optical characteristics of the elementary electron optical systems of each subarray. Alternatively, the average value of the refocus amounts in units of subarrays may be calculated, the refocus amount corresponding to the calculated average value may be set by the refocus coil 6, and the elementary electron optical systems of respective subarrays may set refocus amounts as differences obtained by subtracting the average value from the refocus amounts to be set.

In the above-mentioned correction method, every time the sub deflector 62 deflects a plurality of electron beams coming from the elementary electron optical system array to settle their positions, the refocus amounts of electron beams in units of subarrays are changed. Alternatively, during exposure of one subfield, a constant refocus amount of the electron beams for each subarray may be used, and when the subfield to be exposed is switched to the next one, the refocus amount of electron beams for each subarray may be changed. In this case, the distribution coefficient C in units of subarrays can use the average value of the distribution coefficients C at the respective matrix positions in the subfield to be exposed. In other words, the imaging positions of the electron beams can be corrected in units of subarrays on the basis of the evaluation values in units of a plurality of subarray in each deflection region (subfield).

(Second Correction Method)

Figure 16:
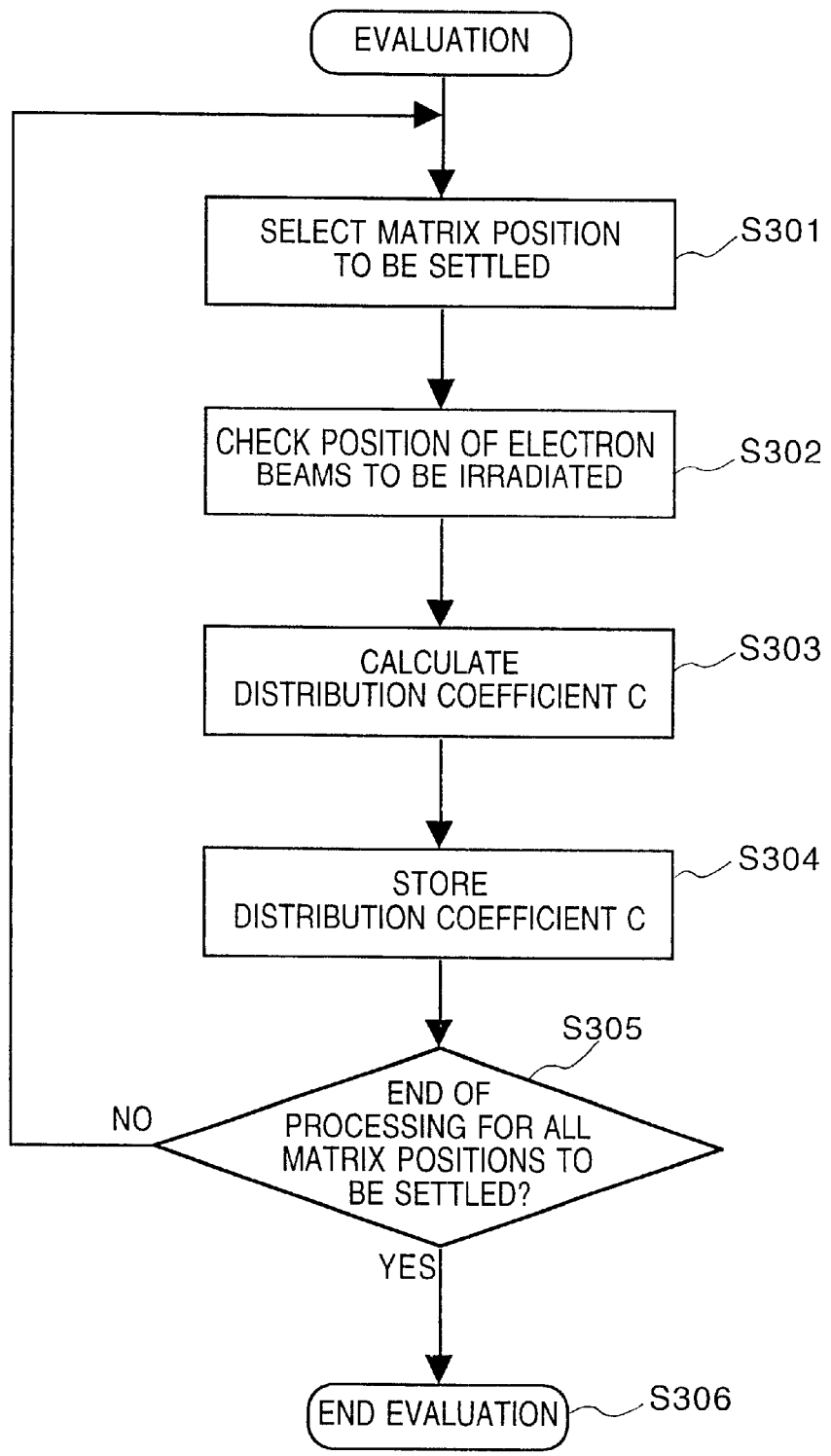
FIG. 16 is a flow chart for explaining evaluation according to a second correction method.

The CPU 25 executes evaluation shown in FIG. 16 on the basis of the formed exposure control data so as to correct blurring produced by the Coulomb effect.

In the evaluation shown in FIG. 16, the distribution coefficient C representing the distribution state of a plurality of electron beams irradiated onto the wafer is calculated in the following procedure at each matrix position to be settled.

(Step S301)

The matrix position (x, y) to be settled is selected.

(Step S302)

The position, on the elementary electron optical system, of an elementary electron optical system that outputs an electron beam to be irradiated onto the wafer at the selected matrix position (x, y) is checked (the position, on the wafer, of that electron beam to be irradiated onto the wafer may be checked, as a matter of course).

For example, if n represents the number of electron beams to be irradiated onto the wafer, a position Pi =(Xi, Yi) (for i=1 to n, Xi is the X-coordinate value on the elementary electron optical system array, and Yi is the Y-coordinate value on the elementary electron optical system array) of each beam is checked.

(Step S303)

The distribution coefficient C is calculated by:

$$C = \sum_{i=1, j=1, j \neq i}^{n} 1/[(Xi - Xj)^2 + (Yi - Yj)^2]$$

As can be seen from the above equation, among all the different combinations of pairs of electron beams which are irradiated onto the wafer without being intercepted, the reciprocal value of the value obtained by calculating the square of the spacing between the pair of electron beams is calculated, and the sum total of the calculated values is the distribution coefficient C. Hence, as the number of electron beams irradiated onto the wafer is larger, the distribution coefficient C becomes larger. Even when the number of electron beams irradiated onto the wafer remains the same, if the electron beams are concentrated on a narrow range, the distribution coefficient C also becomes larger.

(Step S304)

The calculated distribution coefficient C is stored as refocus control data.

(Step S305)

It is checked if the processing in steps S302 to S304 is complete for all the matrix positions (x, y) to be settled. If non-processed matrix positions (x, y) to be settled are found, the flow returns to step S301 to select the next non-processed matrix position (x, y).

(Step S306)

Upon completion of the above processing for all the matrix positions (x, y) to be settled, the evaluation shown in FIG. 16 ends, and refocus control data including distribution coefficients C corresponding to the matrix positions to be settled is stored, as shown in FIG. 17.

In this embodiment, these processing steps are executed by the CPU 25 of the electron beam exposure apparatus. Alternatively, the above steps may be executed by another processing device, and the obtained exposure control data and refocus control data may be transferred to the CPU 25 to achieve the above objective and to obtain the same effects as above.

The CPU 25 then instructs the control system 22 to "execute exposure" via the interface 24. In response to this instruction, the control system 22 executes the following steps on the basis of the data on the memory 23 that stores the exposure control data and refocus control data.

(Step S401)

The control system 22 directs the deflection control circuit 17 to deflect a plurality of electron beams coming from the elementary electron optical system array by the sub deflector 62 of the deflector 6 so as to settle their positions, on the basis of the exposure control data transferred from the memory 23 in synchronism with internal reference clocks.

The control system 22 directs the refocus control circuit 19 to control the focal point position of the reduction electron optical system 4 on the basis of the refocus control data transferred in the same manner as the exposure control data. More specifically, the control system 22 sets the focal point position of the reduction electron optical system 4 to be closer to the reduction electron optical system 4 as the distribution coefficient C is larger. As a result, the imaging position of an electron beam on the wafer, which moves to a position farther from the reduction electron optical system 4 owing to the Coulomb effect as the distribution coefficient C is larger, approaches the reduction electron optical system 4, thus correcting blurring produced by the Coulomb effect. The moving amount of the imaging position of each electron beam on the wafer is called a refocus amount. The relationship between the refocus amount and distribution coefficient C is obtained in advance by numerical simulations or experiments, and the currents to be supplied to the refocus coil 9 are controlled to obtain desired refocus amounts on the basis of the distribution coefficient C.

Furthermore, the control system 22 directs the blanking control circuit 14 to turn on/off the blanking electrodes of the elementary electron optical systems in correspondence with the pattern to be exposed. At this time, the X-Y stage 12 is continuously moving in the X-direction, and the deflection control circuit 17 controls the deflection positions of the electron beams in consideration of the moving amount of the X-Y stage 12.

As a result, an electron beam coming from one elementary electron optical system scans and exposes an exposure field (EF) on the wafer 5 to have a full square as a start point, as shown in FIG. 10A. Also, as shown in FIG. 10B, the exposure fields (EF) of the plurality of elementary electron optical systems in each subarray are set adjacent to each other. Consequently, a subarray exposure field (SEF) including a plurality of exposure fields (EF) is exposed on the wafer 5. At the same time, a subfield made up of subarray exposure fields (SEF) respectively formed by the subarrays A1 to A5 is exposed on the wafer 5, as shown in FIG. 11A. (Step S402)

The control system 22 directs the deflection control circuit 17 to deflect a plurality of electron beams coming from the elementary electron optical system array using the main deflector 61 of the deflector 6, so as to expose subfield 2 after subfield 1, as shown in FIG. 11B. At that time, the control system 22 directs the second focal point/astigmatism control circuit 16 to control the dynamic focus control 7 on the basis of dynamic focus correction data obtained in advance, and to control the dynamic stigmatic coil 8 on the basis of dynamic stigmatic correction data obtained in advance, thereby correcting astigmatism of the reduction electron optical system. Then, the control system 22 executes the operation in step S401 to expose subfield 2.

By repeating steps S401 and S402 above, subfields are sequentially exposed like subfields 3, 4, . . . , as shown in FIG. 11B, thereby exposing the entire surface of the wafer.

In the above correction method, every time the sub deflector 62 deflects a plurality of electron beams coming from the elementary electron optical system array to settle their positions, the refocus amount of each electron beam (the focal point position adjustment amount of the reduction electron optical system 4 by the refocus coil 9) is changed. Alternatively, during exposure of one subfield, a constant refocus amount of the electron beams for each subarray may be used, and when the subfield to be exposed is switched to the next one, the refocus amount of electron beam may be changed. In this case, the control system 22 can use, as the distribution coefficient C, the average value of the distribution coefficients C at the respective matrix positions in the subfield to be exposed. In other words, the focal point position of the reduction electron optical system 4 is adjusted on the basis of the evaluation values of the respective matrix positions in each deflection region (subfield).

(Embodiment of Device Manufacturing Method)

An embodiment of a device manufacturing method using the above-mentioned electron beam exposure apparatus will be explained below.

Figure 12:
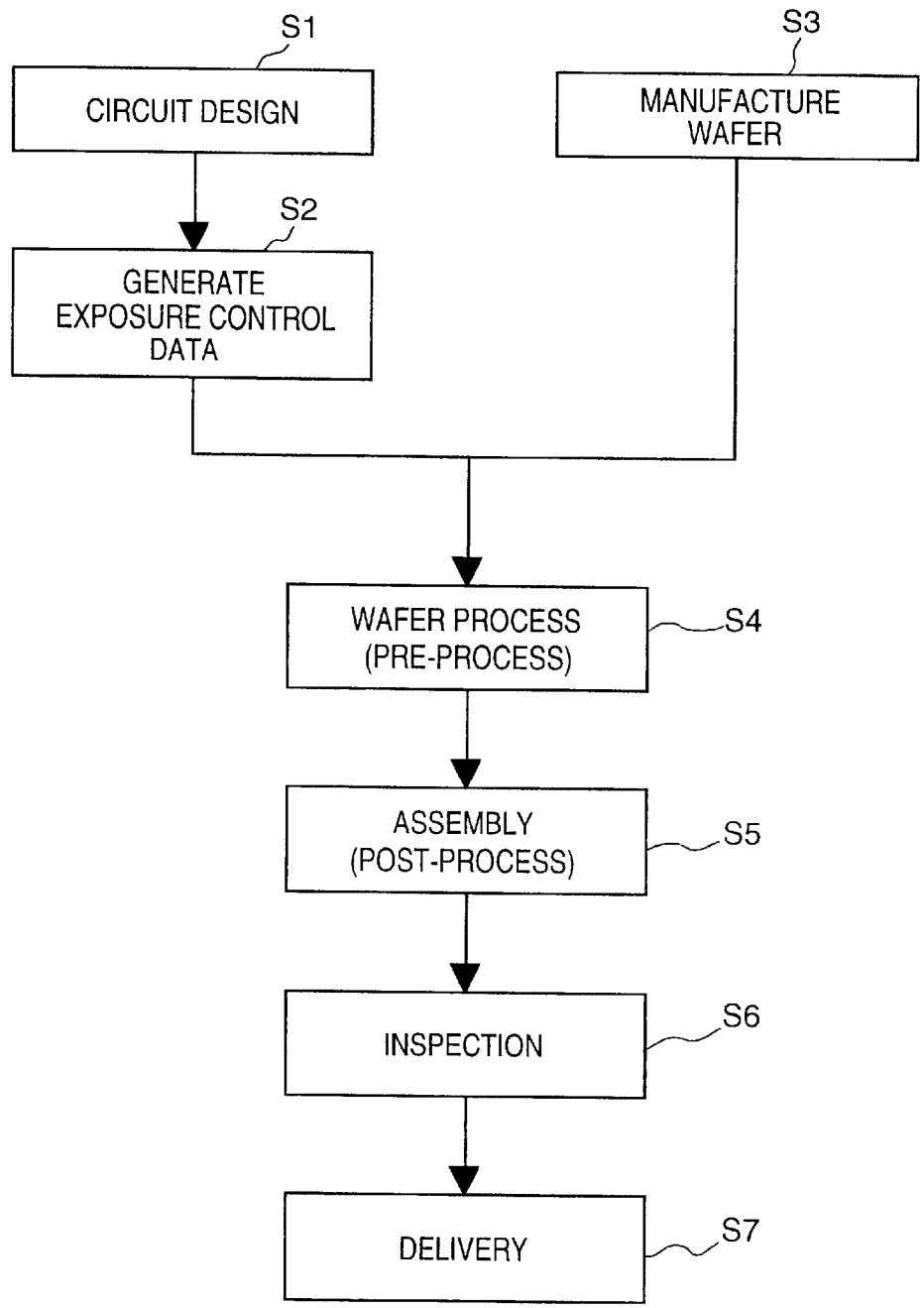
FIG. 12 is a flow chart for explaining the manufacturing flow of microdevices.

FIG. 12 shows the flow in the manufacture of a microdevice (semiconductor chips such as ICs, LSIs, liquid crystal devices, CCDs, thin film magnetic heads, micromachines, and the like). In step 1 (circuit design), the circuit design of a semiconductor device is done. In step 2 (generate exposure control data), the exposure control data of the exposure apparatus is generated based on the designed circuit pattern. Separately, in step 3 (manufacture wafer), a wafer is manufactured using materials such as silicon and the like. Step 4 (wafer process) is called a pre-process, and an actual circuit is formed by lithography on the wafer using the exposure apparatus input with the prepared exposure control data, and the manufactured wafer. The next step 5 (assembly) is called a post-process, in which semiconductor chips are assembled using the wafer obtained in step 4, and includes an assembly process (dicing, bonding), a packaging process (encapsulating chips), and the like. In step 6 (inspection), inspections such as operation tests, durability tests, and the like of semiconductor devices assembled in step 5 are conducted. Semiconductor devices are completed via these processes, and are delivered (step 7).

Figure 13:
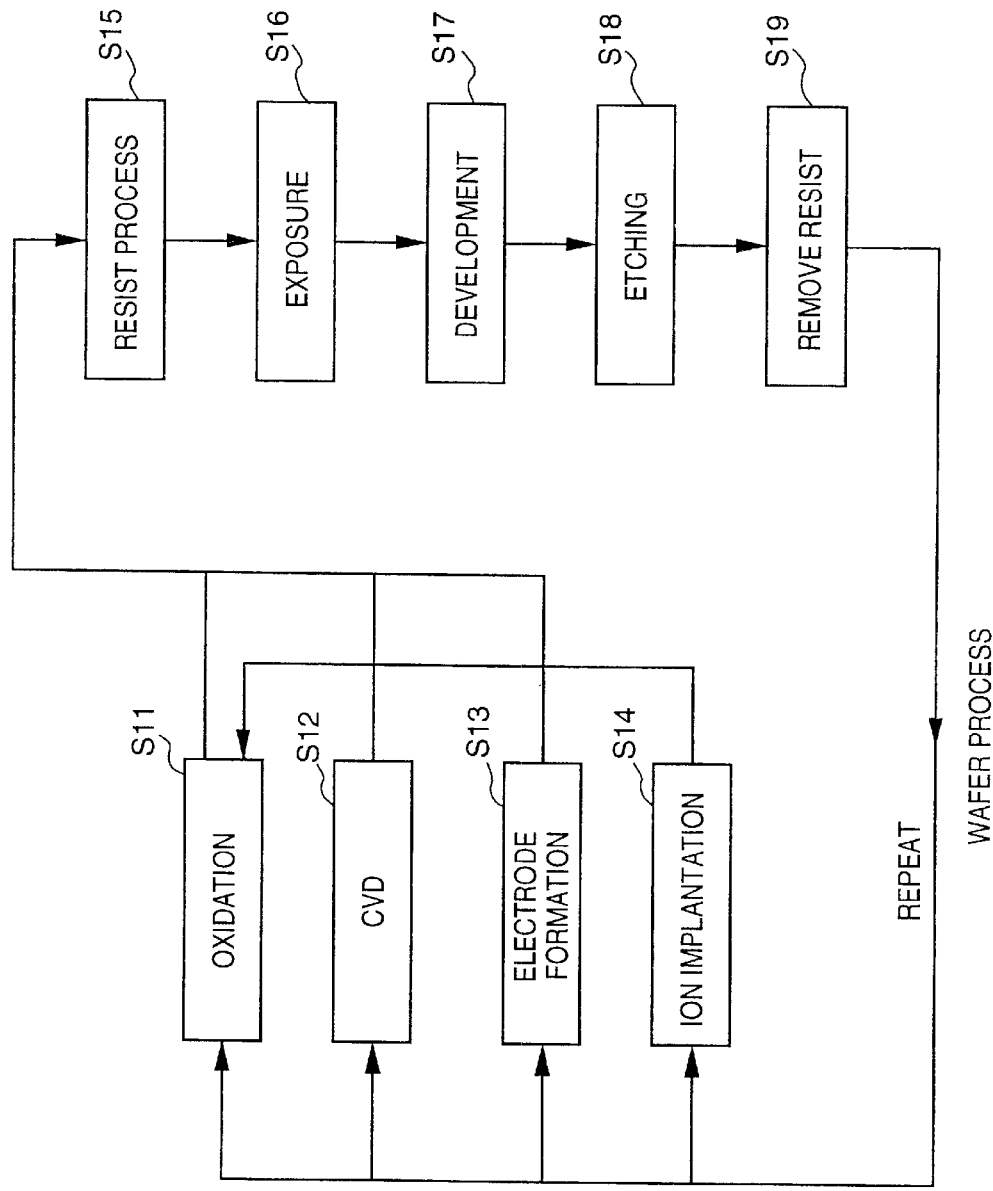
FIG. 13 is a flow chart for explaining the wafer process.

FIG. 13 shows the detailed flow of the wafer process. In step 11 (oxidation), the surface of the wafer is allowed to oxidize. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the above-mentioned exposure apparatus. In step 17 (development), the exposed wafer is developed. In step 18 (etching), a portion other than the developed resist image is removed by etching. In step 19 (remove resist), the resist film which has become unnecessary after the etching is removed. By repetitively executing these steps, multiple circuit patterns are formed on the wafer.

According to the manufacturing method of this embodiment, a highly integrated semiconductor device which is not easy to manufacture by the conventional method can be manufactured at low cost.

According to the present invention, a pattern can be drawn at high resolution by correcting blurring of an electron beam image produced by the Coulomb effect in accordance with the pattern to be exposed.

The present invention is not limited to the above embodiments and various changes and modifications can be made within the spirit and scope of the present invention. Therefore, to apprise the public of the scope of the present invention the following claims are made.

What is claimed is:

1. An electron beam exposure apparatus for forming a pattern on a substrate by exposure using a plurality of electron beams, comprising:

an electron beam source for generating a plurality of electron beams in accordance with a pattern to be exposed;

a reduction electron optical system for imaging the plurality of electron beams emitted by said electron beam source on the substrate;

a scanning unit for scanning the plurality of electron beams on the substrate; and a correction unit for correcting imaging positions of the plurality of electron beams on the basis of correction data corresponding to a distribution of the plurality of electron beams.

2. The apparatus according to claim 1, wherein said correction unit adjusts a focal point position of said reduction electron optical system on the basis of the correction data.

3. The apparatus according to claim 1, wherein said electron beam source comprises:

an electron source;

a plurality of elementary electron optical systems for forming intermediate images of said electron source; and a control unit for controlling whether each of said plurality of elementary electron optical systems forms an intermediate image of said electron source.

4. The apparatus according to claim 3, wherein said correction unit adjusts imaging positions of the intermediate images in an axial direction of said reduction electron optical system on the basis of the correction data.

5. The apparatus according to claim 3, wherein said correction unit adjusts imaging positions of the intermediate images in an axial direction of said reduction electron optical system, and a focal point position of said reduction electron optical system on the basis of the correction data.

6. The apparatus according to claim 3, wherein a subarray is formed by a matrix of a plurality of elementary electron optical systems and an entire array is formed by a matrix of a plurality of subarrays.

7. The apparatus according to claim 6, wherein said correction unit corrects imaging positions of the intermediate images in an axial direction of said reduction electron optical system in units of subarrays on the basis of the correction data.

8. The apparatus according to claim 6, wherein said correction unit commonly corrects imaging positions of electron beams coming from all the elementary electron optical systems of the entire array by adjusting a focal point position of said reduction electron optical system on the basis of the correction data, and adjusts imaging positions of the intermediate images in an axial direction of said reduction electron optical system in units of subarrays on the basis of differences between the common correction amount and appropriate correction amounts.

9. The apparatus according to claim 1, wherein said scanning unit comprises a main deflector and a sub deflector for deflecting electron beams emitted by said electron beam source, said scanning unit divides an exposure region on the substrate into a plurality of fields, switches the field to be exposed by said main deflector, and scans the plurality of electron beams in each field using said sub deflector, and a constant correction amount for imaging positions of the plurality of electron beams is maintained while a pattern is drawn on each field.

10. The apparatus according to claim 1, wherein said correction unit dynamically corrects imaging positions of the plurality of electron beams emitted by said electron beam source on the basis of the correction data.

11. The apparatus according to claim 10, wherein said correction unit corrects the imaging positions of the plurality of electron beams on the basis of the correction data each time a positional relationship between the plurality of electron beams emitted by said electron beam source and the substrate is settled.

12. The apparatus according to claim 6, wherein the correction data is a function having, as variables, at least:

the number of electron beams coming from the subarray corresponding to an object to be corrected;

a distance between the subarray corresponding to the object to be corrected, and another subarray that outputs the electron beams; and the number of electron beams coming from the other subarray.

13. The apparatus according to claim 6, wherein the correction data is a function having, as a variable, at least a spacing of electron beams emitted by said electron source.

14. The apparatus according to claim 1, further comprising a calculation unit for generating correction data used for correcting imaging positions of the plurality of electron beams on the basis of data that defines the pattern to be exposed on the substrate.

15. An electron beam exposure method for forming a pattern on a substrate by exposure using a plurality of electron beams, comprising the steps of:

imaging a plurality of electron beams, which are emitted by an electron beam source in accordance with a pattern to be exposed, via a reduction electron optical system, and scanning the plurality of electron beams on the substrate; and correcting imaging positions of the plurality of electron beams on the basis of correction data corresponding to a distribution of the plurality of electron beams in synchronism with the scan.

16. The method according to claim 15, wherein the correcting step includes the step of adjusting a focal point position of said reduction electron optical system on the basis of the correction data.

17. The method according to claim 15, wherein said electron beam source comprises:

an electron source;

a plurality of elementary electron optical systems for forming intermediate images of said electron source; and a control unit for controlling whether each of said plurality of elementary electron optical systems forms an intermediate image of said electron source.

18. The method according to claim 17, wherein the correcting step includes the step of adjusting imaging positions of the intermediate images in an axial direction of said reduction electron optical system on the basis of the correction data.

19. The method according to claim 17, wherein the correcting step includes the step of adjusting imaging positions of the intermediate images in an axial direction of said reduction electron optical system, and a focal point position of said reduction electron optical system on the basis of the correction data.

20. The method according to claim 17, wherein a subarray is formed by a matrix of a plurality of elementary electron optical systems and an entire array is formed by a matrix of a plurality of subarrays.

21. The method according to claim 20, wherein the correcting step includes the step of correcting imaging positions of the intermediate images in an axial direction of said reduction electron optical system in units of subarrays on the basis of the correction data.

22. The method according to claim 20, wherein the correcting step includes the step of commonly correcting imaging positions of electron beams coming from all the elementary electron optical systems of the entire array by adjusting a focal point position of said reduction electron optical system on the basis of the correction data, and adjusting imaging positions of the intermediate images in an axial direction of said reduction electron optical system in units of subarrays on the basis of differences between the common correction amount and appropriate correction amounts.

23. The method according to claim 15, wherein an exposure region on the substrate is divided into a plurality of fields, the field to be exposed is switched by a main deflector, and the plurality of electron beams in each field is scanned using a sub deflector, and a constant correction amount for imaging positions of the plurality of electron beams is maintained while a pattern is drawn on each field.

24. The method according to claim 15, wherein the correcting step includes the step of dynamically correcting imaging positions of the plurality of electron beams emitted by the electron beam source on the basis of the correction data.

25. The method according to claim 24, wherein the correcting step includes the step of correcting the imaging positions of the plurality of electron beams on the basis of the correction data each time a positional relationship between the plurality of electron beams emitted by the electron beam source and the substrate is settled.

26. The method according to claim 20, wherein the correction data is a function having, as variables, at least:

the number of electron beams coming from the subarray corresponding to an object to be corrected;

a distance between the subarray corresponding to the object to be corrected, and another subarray that outputs the electron beams; and the number of electron beams coming from the other subarray.

27. The method according to claim 20, wherein the correction data is a function having, as a variable, at least a spacing of electron beams emitted by said electron beam source.

28. The method according to claim 15, further comprising a step of generating correction data used for correcting imaging positions of the plurality of electron beams on the basis of data that defines the pattern to be exposed on the substrate.

29. A method of generating data for controlling an electron beam exposure apparatus of claim 1, comprising the steps of:

inputting data that defines a pattern to be exposed on a substrate; and generating correction data used for correcting imaging positions of a plurality of electron beams on the basis of the input data.

30. The method according to claim 29, wherein the correction data generation step includes a step of generating the correction data on the basis of a distribution of electron beams that make up the plurality of electron beams emitted by an electron beam source.

31. The method according to claim 29, wherein the correction data generation step includes a step of generating the correction data for correcting the imaging positions of the plurality of electron beams when a positional relationship between the plurality of electron beams and the substrate is settled.

32. A computer readable program for generating data for controlling an electron beam exposure apparatus of claim 1, comprising the steps of:

inputting data that defines a pattern to be exposed on a substrate; and generating correction data used for correcting imaging positions of a plurality of electron beams on the basis of the input data.

33. The program according to claim 32, wherein the correction data generation step includes a step of generating the correction data on the basis of the number of electron beams that make up the plurality of electron beams emitted by an electron beam source.

34. The program according to claim 32, wherein the correction data generation step includes a step of generating the correction data on the basis of a distribution of electron beams that make up the plurality of electron beams emitted by an electron beam source.

35. The method according to claim 32, wherein the correction data generation step includes a step of generating the correction data for correcting the imaging positions of the plurality of electron beams when a positional relationship between the plurality of electron beams and the substrate is settled.

36. A method of manufacturing a device using an electron beam exposure apparatus of claim 1 in some steps.

37. A method of manufacturing a device using an electron beam exposure method of claim 15 in some steps.

38. An electron beam exposure apparatus which forms a pattern on a substrate by exposure using a plurality of electron beams, comprising:

an electron beam source which generates a plurality of electron beams in accordance with a pattern to be exposed;

a reduction electron optical system which images the plurality of electron beams emitted by said electron beam source on the substrate;

a scanning unit which scans the plurality of electron beams on the substrate; and a correction unit which corrects imaging positions of the plurality of electron beams on the basis of a distribution of the plurality of electron beams.

39. The apparatus according to claim 38, wherein said correction unit adjusts a focal point position of said reduction electron optical system on the basis of the distribution of the plurality of electron beams.

40. The apparatus according to claim 38, wherein said electron beam source comprises:

an electron source;

a plurality of elementary electron optical systems which form intermediate images of said electron source; and a control unit which controls whether each of said plurality of elementary electron optical systems forms an intermediate image of said electron source.

41. The apparatus according to claim 40, wherein said correction unit adjusts imaging positions of the intermediate images in an axial direction of said reduction electron optical system on the basis of the distribution of the plurality of electron beams.

42. The apparatus according to claim 40, wherein said correction unit adjusts imaging positions of the intermediate images in an axial direction of said reduction electron optical system, and a focal point position of said reduction electron optical system on the basis of the distribution of the plurality of electron beams.

43. The apparatus according to claim 40, wherein a subarray is formed by a matrix of a plurality of elementary electron optical systems and an entire array is formed by a matrix of a plurality of subarrays.

44. The apparatus according to claim 43, wherein said correction unit corrects imaging positions of the intermediate images in an axial direction of said reduction electron optical system in units of subarrays on the basis of the distribution of the plurality of electron beams.

45. The apparatus according to claim 43, wherein said correction unit commonly corrects imaging positions of electron beams coming from all the elementary electron optical systems of the entire array by adjusting a focal point position of said reduction electron optical system on the basis of the distribution of the plurality of electron beams, and adjusts imaging positions of the intermediate images in an axial direction of said reduction electron optical system in units of subarrays on the basis of differences between the common correction amount and appropriate correction amounts.

46. The apparatus according to claim 38, wherein said scanning unit comprises a main deflector and a sub deflector which deflect electron beams emitted by said electron beam source,
- said scanning unit divides an exposure region on the substrate into a plurality of fields, switches the field to be exposed by said main deflector, and scans the plurality of electron beams in each field using said sub deflector, and
- a constant correction amount for imaging positions of the plurality of electron beams is maintained while a pattern is drawn on each field.

47. The apparatus according to claim 38, wherein said correction unit dynamically corrects imaging positions of the plurality of electron beams emitted by said electron beam source on the basis of the distribution of the plurality of electron beams.

48. The apparatus according to claim 47, wherein said correction unit corrects the imaging positions of the plurality of electron beams on the basis of the distribution of the plurality of electron beams each time a positional relationship between the plurality of electron beams emitted by said electron beam source and the substrate is settled.

49. The apparatus according to claim 43, wherein the distribution of the plurality of electron beams is expressed by a function having, as variables, at least:
- the number of electron beams coming from the subarray corresponding to an object to be corrected;
- a distance between the subarray corresponding to the object to be corrected, and another subarray that outputs the electron beams; and
- the number of electron beams coming from the other subarray.

50. The apparatus according to claim 43, wherein the distribution of the plurality of electron beams is expressed by a function having, as a variable, at least a spacing of electron beams emitted by said electron source.

* * * * *

UNITED STATES PATENT AND TRADEMARK OFFICE
CERTIFICATE OF CORRECTION

PATENT NO. : 6,274,877 B1 Page 1 of 1
DATED : August 14, 2001
INVENTOR(S) : Masato Muraki It is certified that error appears in the above-identified patent and that said Letters Patent is hereby corrected as shown below:

<u>Column 7,</u>
Line 51, "a plurality of" should be deleted.

Signed and Sealed this

Twenty-sixth Day of February, 2002

Attest:

JAMES E. ROGAN
Attesting Officer *Director of the United States Patent and Trademark Office*